US011721932B2

(12) United States Patent
Rahm et al.

(10) Patent No.: US 11,721,932 B2
(45) Date of Patent: Aug. 8, 2023

(54) TOOL-LESS SERVICE CABLE CONNECTOR AND CORRESPONDING SYSTEMS AND METHODS

(71) Applicant: ARRIS Enterprises LLC, Suwanee, GA (US)

(72) Inventors: James K. Rahm, Allentown, PA (US); Jared M. Gordon, Hatfield, PA (US)

(73) Assignee: ARRIS Enterprises LLC, Suwanee, GA (US)

( * ) Notice: Subject to any disclaimer, the term of this patent is extended or adjusted under 35 U.S.C. 154(b) by 498 days.

(21) Appl. No.: 16/919,781

(22) Filed: Jul. 2, 2020

(65) Prior Publication Data
US 2021/0013668 A1 Jan. 14, 2021

Related U.S. Application Data

(60) Provisional application No. 62/871,989, filed on Jul. 9, 2019.

(51) Int. Cl.
*H01R 13/46* (2006.01)
*H01R 13/52* (2006.01)
(Continued)

(52) U.S. Cl.
CPC ....... *H01R 13/5205* (2013.01); *G02B 6/3644* (2013.01); *G02B 6/3825* (2013.01);
(Continued)

(58) Field of Classification Search
CPC ............ H01R 13/5205; H01R 13/5202; H01R 13/52; H01R 13/46; H01R 24/564;
(Continued)

(56) References Cited

U.S. PATENT DOCUMENTS 1,809,582 A * 6/1931 Church .................. F16L 19/08
285/341
4,090,029 A * 5/1978 Lundeberg ........... H02G 3/0616
174/665
(Continued)

FOREIGN PATENT DOCUMENTS

| GB | 28094 | 4/1913 |
| GB | 266109 A | 2/1927 |

OTHER PUBLICATIONS

PCT International Search Report and Written Opinion Re: Application No. PCT/US2020/041339 dated Sep. 28, 2020.

*Primary Examiner* — Harshad C Patel
(74) *Attorney, Agent, or Firm* — Chernoff, Vilhauer, McClung & Stenzel, LLP

(57) ABSTRACT

A system includes a housing (105) that includes one or more ports (113) through which electrical connections to one or more electronic components situated within the housing can be made from exterior of the housing. At least one enclosure bushing (204) is coupled to at least one port. The enclosure bushing includes a cylindrical service jacket receiver (207) defining a lumen (208), a flange (212) abutting a portion of the housing, and one or more lugs (216,217,302,303) extending from a portion of the cylindrical service jacket receiver. A coupling nut (205) having one or more circumferential lug receivers (702,703,704,805) applies a compression force to the frustoconical weather gasket when the one or more lugs engaging the locking notch (708) of the one or more circumferential lug receivers.

19 Claims, 11 Drawing Sheets

(51) Int. Cl.
  *G02B 6/36* (2006.01)
  *G02B 6/38* (2006.01)
  *G02B 6/44* (2006.01)
  *H01R 24/56* (2011.01)
  *H02G 15/013* (2006.01)

(52) U.S. Cl.
  CPC ......... *G02B 6/3878* (2013.01); *G02B 6/4446* (2013.01); *H01R 24/564* (2013.01); *H02G 15/013* (2013.01)

(58) Field of Classification Search
  CPC ...... G02B 6/2638; G02B 6/36; G02B 6/3644; G02B 6/3825; G02B 6/3822; G02B 6/3878; G02B 6/3869; G02B 6/4446; H02G 15/013
  See application file for complete search history.

(56) References Cited

U.S. PATENT DOCUMENTS

| | | | |
|---|---|---|---|
| 5,037,140 A * | 8/1991 | Anderson | A62C 35/68 285/341 |
| 5,789,706 A * | 8/1998 | Perkins | H02G 3/0691 D13/152 |
| 5,929,383 A * | 7/1999 | Marik | H02G 15/04 439/98 |
| 6,268,565 B1 * | 7/2001 | Daoud | H02G 3/0675 285/348 |
| 6,335,488 B1 * | 1/2002 | Gretz | H02G 3/0691 16/202 |
| 6,487,344 B1 * | 11/2002 | Naudin | H02G 15/007 385/100 |
| 6,669,506 B2 * | 12/2003 | Newton | B60T 13/665 439/564 |
| 7,080,859 B1 * | 7/2006 | Gretz | F16L 19/10 285/151.1 |
| 7,281,932 B2 * | 10/2007 | Cheng | H02G 3/0616 439/100 |
| 7,735,876 B2 * | 6/2010 | Chiu | F16L 5/00 403/240 |
| 7,914,298 B2 * | 3/2011 | Lauermann | H02G 3/088 439/76.1 |
| 8,137,136 B1 * | 3/2012 | Bench | H01R 13/5216 439/604 |
| 8,500,486 B2 * | 8/2013 | Buck | H01R 13/645 439/551 |
| 8,899,998 B2 * | 12/2014 | Pyron | H01R 4/643 439/100 |
| 8,934,754 B2 * | 1/2015 | Billau | H04N 9/8205 386/226 |
| 9,004,928 B2 * | 4/2015 | Tanaka | H01R 24/76 439/86 |
| 9,178,303 B2 * | 11/2015 | Franke | H02G 15/115 |
| 9,306,313 B2 * | 4/2016 | Heggemann | H01R 13/40 |
| 9,343,883 B2 * | 5/2016 | DeCesare | H02G 3/0616 |
| 9,923,354 B2 * | 3/2018 | Crompton | H02G 15/013 |
| 10,090,653 B2 * | 10/2018 | Gibson | H02G 3/0675 |
| 10,114,175 B2 | 10/2018 | Fletcher | |
| 10,240,694 B2 * | 3/2019 | DeCesare | H02G 3/0616 |
| 10,317,627 B2 * | 6/2019 | Beier | G02B 6/3869 |
| 10,411,446 B2 * | 9/2019 | Yang | H02G 3/06 |
| 10,499,544 B1 * | 12/2019 | Rahm | H05K 5/0226 |
| 2002/0149157 A1 * | 10/2002 | Milanowski | H02G 15/013 277/607 |
| 2003/0037944 A1 * | 2/2003 | Pyron | H02G 11/00 174/480 |
| 2007/0017688 A1 * | 1/2007 | Pyron | H01R 13/5219 174/59 |
| 2008/0025977 A1 | 1/2008 | Young et al. | |
| 2009/0025977 A1 * | 1/2009 | Anderson | H02G 3/0675 174/653 |
| 2011/0033157 A1 * | 2/2011 | Drouard | H01R 13/59 174/655 |
| 2011/0147081 A1 * | 6/2011 | Best | H02G 3/0691 174/84 R |
| 2012/0142207 A1 | 6/2012 | Duval et al. | |
| 2013/0015656 A1 | 1/2013 | Ehrke et al. | |
| 2014/0097023 A1 * | 4/2014 | Dinh | H02G 15/04 174/77 R |
| 2018/0269674 A1 | 9/2018 | Dong | |
| 2019/0063055 A1 | 2/2019 | Gerger | |
| 2019/0170961 A1 * | 6/2019 | Coenegracht | G02B 6/4444 |

* cited by examiner

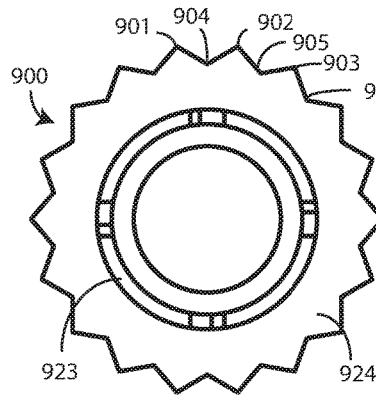
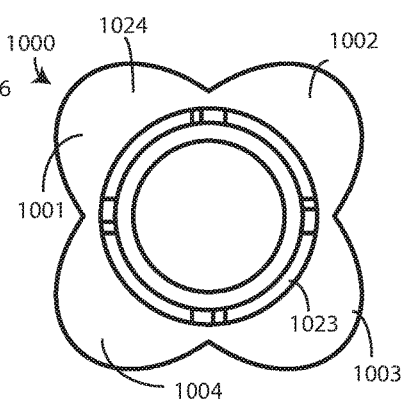
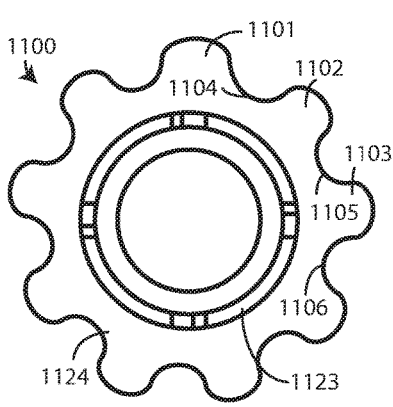
*FIG. 9*     *FIG. 10*     *FIG. 11*
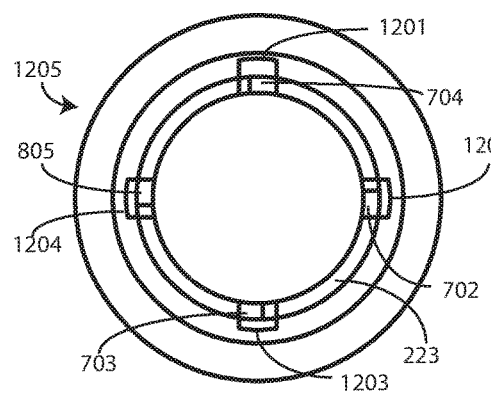
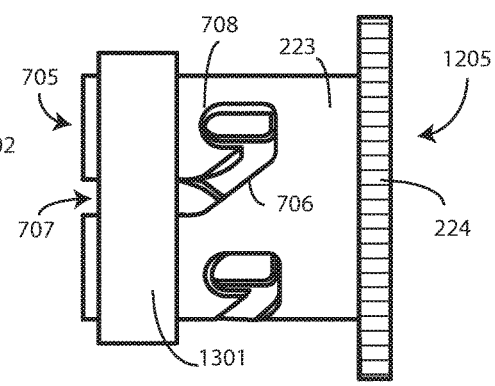
*FIG. 12*     *FIG. 13*
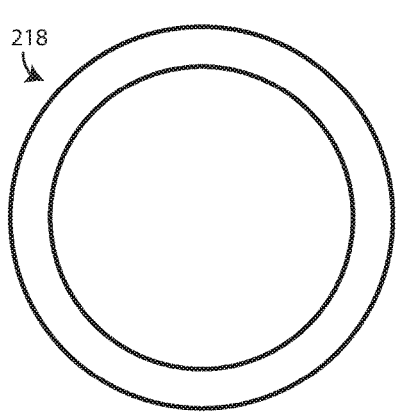
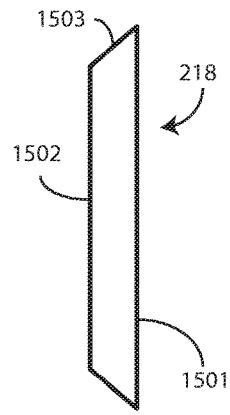
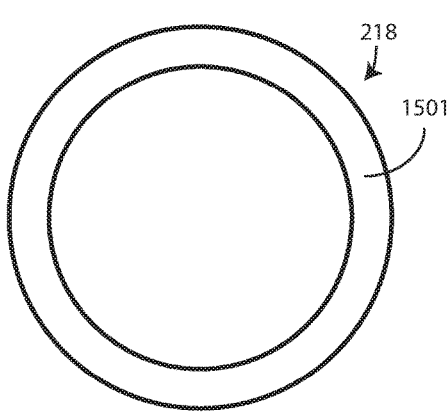
*FIG. 14*     *FIG. 15*     *FIG. 16*

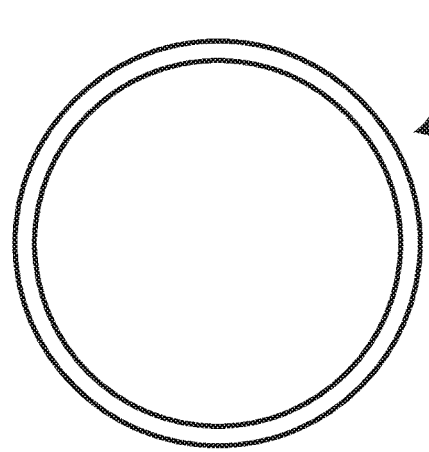
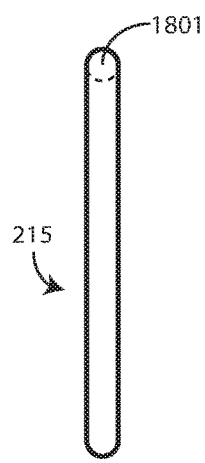
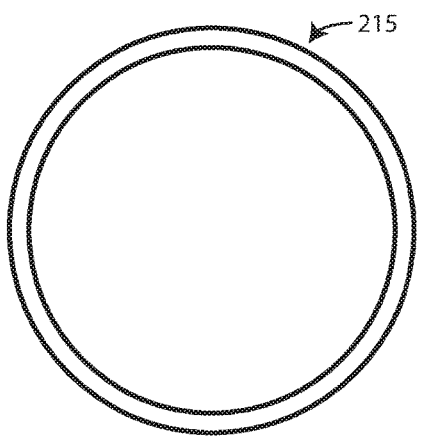
*FIG. 17*    *FIG. 18*    *FIG. 19*
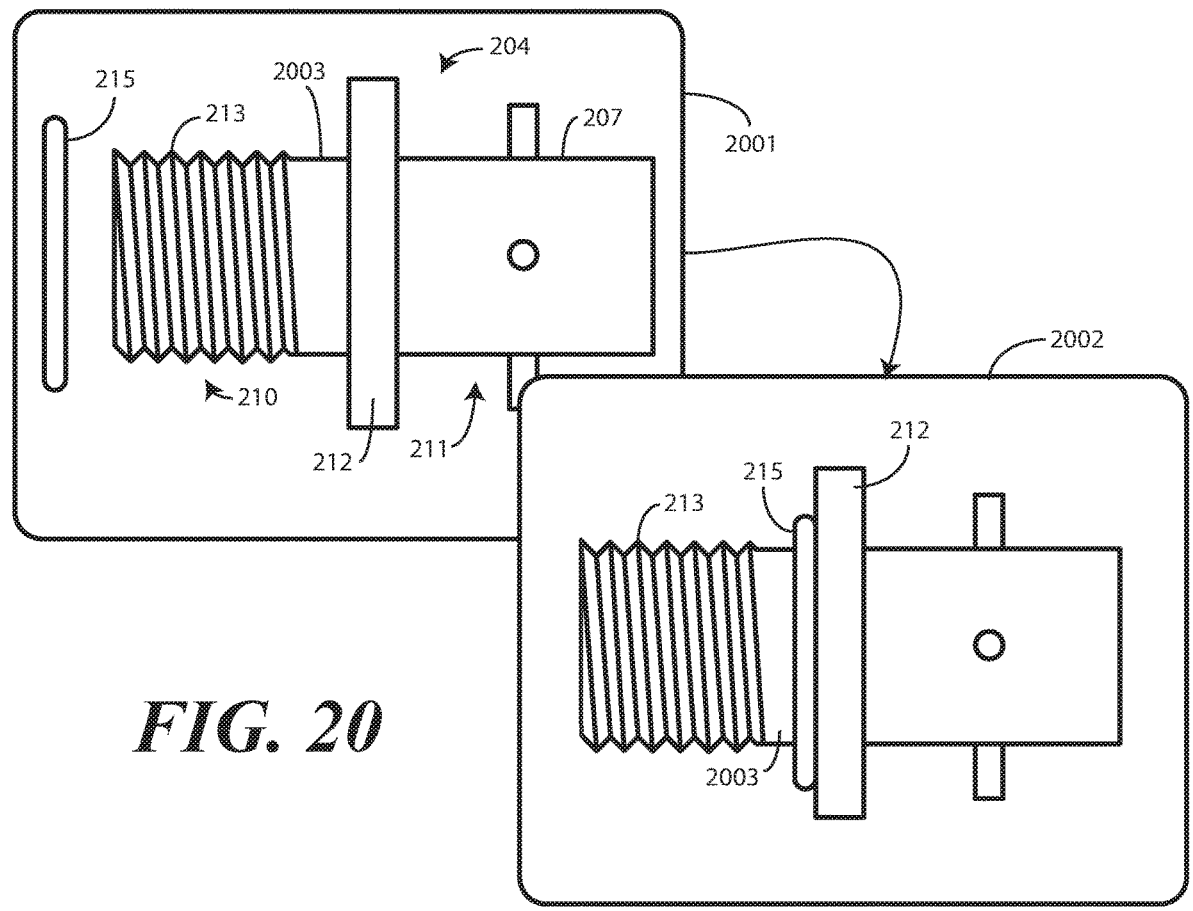
*FIG. 20*

TOOL-LESS SERVICE CABLE CONNECTOR AND CORRESPONDING SYSTEMS AND METHODS

CROSS-REFERENCES TO RELATED APPLICATIONS

This application claims priority to U.S. Provisional Patent Application No. 62/871,989 filed on Jul. 9, 2019, entitled "TOOL-LESS SERVICE CABLE CONNECTOR AND CORRESPONDING SYSTEMS AND METHODS", the disclosure of which is hereby incorporated by reference.

BACKGROUND

Technical Field

This disclosure relates generally to mechanical couplings, and more particularly to mechanical service cable coupling.

Background Art

Electronic components are generally disposed within a housing of some sort for physical protection. Where the housing is designed to reside outdoors, both the housing and any external couplings thereto must be robust and weatherproof.

Service cables, sometimes referred to as "stub cables," are environmentally ruggedized cables that are frequently used in outdoor environments. Wires, optical fibers, and other conduit pass through the service cable and into a port in the side of the housing to couple to the electronic circuitry disposed within the housing. In traditional systems, the service cable couples to the housing or port using a ruggedized jacket and a mechanical system employing threaded metal bushings. The typical threaded bushing system includes a plurality of threaded sections engaging a plurality of O-rings, with each section using a threaded screw seal.

The problem with these threaded bushing systems is that they are cumbersome to install. Further, even when fully installed, it is difficult to determine whether the threaded bushing system is weatherproof. A technician is required to use a special tool capable of measuring applied torque, and must ensure that each threaded screw seal is secured with just the right amount of torque. In addition to this complicating the process, many technicians do not carry such torque measuring wrenches as a matter of course. It would be advantageous to have an improved connector system that simplified the coupling process while ensuring a weatherproof connection between connector and housing.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

FIG. 9 illustrates a front elevation view of an alternate coupling nut in accordance with one or more embodiments of the disclosure.

FIG. 10 illustrates a front elevation view of yet another alternate coupling nut in accordance with one or more embodiments of the disclosure.

FIG. 11 illustrates a front elevation view of still another alternate coupling nut in accordance with one or more embodiments of the disclosure.

FIG. 12 illustrates a front elevation view of still another alternate coupling nut in accordance with one or more embodiments of the disclosure.

FIG. 13 illustrates a side elevation view of the coupling nut of FIG. 12.

FIG. 14 illustrates a front elevation view of one explanatory frustoconical weather gasket in accordance with one or more embodiments of the disclosure.

FIG. 15 illustrates a side elevation view of one explanatory frustoconical weather gasket in accordance with one or more embodiments of the disclosure.

FIG. 16 illustrates a rear elevation view of one explanatory frustoconical weather gasket in accordance with one or more embodiments of the disclosure.

FIG. 17 illustrates a front elevation view of one explanatory toroidal weather gasket in accordance with one or more embodiments of the disclosure.

FIG. 18 illustrates a side elevation view of one explanatory toroidal weather gasket in accordance with one or more embodiments of the disclosure.

FIG. 19 illustrates a rear elevation view of one explanatory toroidal weather gasket in accordance with one or more embodiments of the disclosure.

FIG. 20 illustrates one or more method steps in accordance with one or more embodiments of the disclosure.

Figure 1:
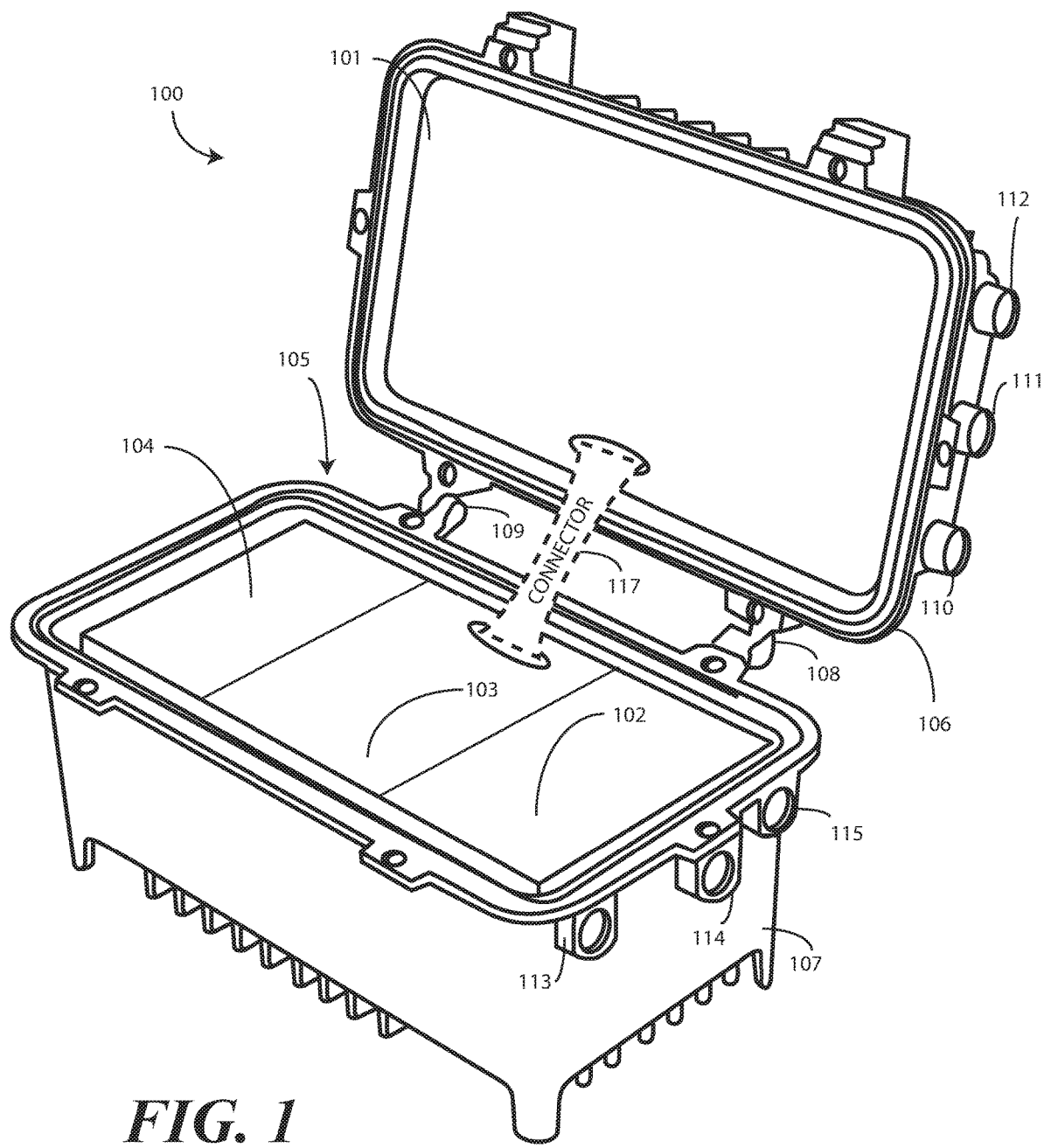
FIG. 1 illustrates one explanatory housing in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

The terms "substantially", "essentially", "approximately", "about" or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

Embodiments of the disclosure contemplate that water penetration of electronics enclosures, or housings, designed for outdoor use can cause expensive damage to the electronic components situated therein. Embodiments of the disclosure also contemplate that it is difficult to ensure a weatherproof seal using prior art connector systems employing multiple sections, multiple O-rings, and multiple threads. This is true because these connectors are mechanically cumbersome to put together, which can result in them being improperly assembled. Moreover, they are "torque sensitive" in that the connector may not be weatherproof if too little, or too much, torque is applied to any one of the multiple threaded connections. Accordingly, these prior art connectors are frequently unreliable and often expensive.

Prior art service connectors all require the application of precisely measured torques to each and every threaded connection to ensure that the plurality of sections is coupled together in a weatherproof fashion. Installation crews, therefore, require bulky and expensive calibrated torque wrenches to put these prior art connectors together.

Moreover, these installation technicians are sometimes required to hold one section of the threaded bushing system steady while fastening others in a multi-step installation process. This creates difficulties, in that unintended movement of sections already fastened may change result in under-torqued and over-torqued nuts. This can lead to unreliable and non-weatherproof connectors. What's more, "over-torqueing" nuts can damage gaskets, which means that if these gaskets are not replaced immediately, there will be no weatherproof connection. Damaged electronics from water penetration in electronics enclosures and housings can be a significant risk and cost driver for many industries, including those delivering Internet, television, and other data connections to customers. Once an electronics enclosure or housing is damaged by water, replacing the electronics therein is very expensive. Further, it frequently leads to significant network downtime.

Embodiments of the disclosure advantageously provide solutions to these and other problems by providing a tool-less mechanical connector suitable for coupling a service cable to a housing in outdoor environments. The tool-less mechanical connector advantageously eliminates the need for specialized tools such as torque-measuring wrenches. In one or more embodiments, a technician can simply use a hand to couple a connector nut to an enclosure bushing, thereby ensuring that a weatherproof connection occurs between the connector, service, cable, and housing.

In one or more embodiments, the tool-less connector comprises an enclosure bushing and a coupling nut. In one or more embodiments, the enclosure bushing comprises a cylindrical service jacket receiver defining a lumen through which one or more electrical conductors, optical fibers, or other long, thin objects, e.g., mechanical wires, supports, or components, may pass. In one or more embodiments, these electrical conductors, optical fibers, or other objects are enshrouded in a service jacket, thereby defining a service cable. The service jacket can be inserted into the cylindrical service jacket receiver so that the optical fibers or other components can pass through the lumen.

In one or more embodiments, the cylindrical service jacket receiver defines a first portion and a second portion. In one or more embodiments, a flange separates the first portion and the second portion.

In one or more embodiments, the first portion extends into, and couples to, a port of an electronics enclosure or housing. For example, in one embodiment the first portion comprises a threaded end, which screws into complementary threads situated within a port of a housing.

In one or more embodiments, this threaded end is perdurably coupled to the housing in the factory prior to the housing being delivered to the field. For example, in one or more embodiments the threaded end is perdurably coupled to the port with a potting material or other perdurable adhesive that is placed between the threaded end of the cylindrical service jacket receiver and the complementary threads defining the threaded receiver of the port.

In one or more embodiments, the flange of the enclosure bushing abuts the housing when the threaded end of the cylindrical service jacket receiver is fully inserted into the threaded receiver of the port of the housing. An optional toroidal weather gasket can be positioned between the housing and the flange in one or more embodiments. Where the housing is configured as an electrical equipment trunk, and the threaded receiver of the electrical equipment trunk defines a threaded port, the optional toroidal weather gasket can be situated between the flange and a portion of the electrical equipment trunk surrounding the at least one threaded port.

In one or more embodiments, the second portion of the cylindrical service jacket receiver supports one or more lugs. In one or more embodiments, the one or more lugs extend distally from an outer surface of the cylindrical service jacket receiver. In one or more embodiments, each lug of the one or more lugs has a circular cross section.

In one or more embodiments, a frustoconical weather jacket is coupled to, and circumscribes, the service jacket. As used herein, "frustoconical" takes its ordinary, plain, English definition of "having the shape of a frustum of a cone." A "frustum" of a cone, of course, is the portion of a cone or pyramid that lies between two parallel planes cutting it. Thus, a frustoconical shape looks, when viewed from the side, like a cone that has had its point sliced off, with the slice removing the point being made parallel to the base of the cone.

In one or more embodiments, prior to coupling the frustoconical weather gasket to the service jacket, the coupling nut is placed about the service jacket such that the coupling nut encircles the service jacket and can translate along the outer surface of the service jacket. In one or more embodiments, the coupling nut comprises a cylindrical service jacket receiver engagement ring and a disc grip. In one or more embodiments, the cylindrical service jacket receiver engagement ring defines one or more circumferential lug receivers. In one or more embodiments, each circumferential lug receiver comprises a receiving slot and a locking notch, which is situated at a terminal end of the receiving slot.

In one or more embodiments, after the frustoconical weather gasket is placed about the service jacket, the coupling nut passes about the frustoconical weather gasket and engages the cylindrical service jacket receiver of the enclosure bushing. In one or more embodiments, the one or more lugs extending from the outer surface of the second portion of the cylindrical service jacket receiver insert into the receiving slots of the cylindrical service jacket receiver engagement ring of the coupling nut, ultimately seating within the locking notches.

In one or more embodiments, when this occurs, the coupling nut applies a compression force to the frustoconical weather gasket, causing the frustoconical weather gasket to compress between an interior base surface of the coupling nut and the distal end of the second portion of the cylindrical service jacket receiver of the enclosure bushing. This compression of the frustoconical weather gasket ensures a weather tight seal at the port, as the frustoconical weather gasket is compressed so as to expand and fill any void between the service jacket and the distal end of the second portion of the cylindrical service jacket receiver of the enclosure bushing. Advantageously, this process can be performed using only a hand, and does not require any special tools or torque-sensing wrenches.

In one or more embodiments, to couple a service cable to a housing in accordance with embodiments of the disclosure, one first slides the objects passing through the service jacket, e.g., the wires, optical fibers, or other items, through a port of the housing. As necessary, these objects can be coupled to electronic components disposed within the housing. For example, if the items are optical fibers, they can mate with optical fiber receiving modules situated within the housing.

Next, the service jacket is inserted into the distal end of the second portion of the cylindrical service jacket receiver of the enclosure bushing. In one or more embodiments, the service jacket is inserted into the second portion of the cylindrical jacket service receiver until the frustoconical weather gasket abuts the distal end of the second portion of the cylindrical service jacket receiver of the enclosure bushing.

Next, the coupling nut is passed about the frustoconical weather gasket such that the lugs extending distally from the outer surface of the cylindrical service jacket receiver align with the circumferential lug receivers defined in the cylindrical service jacket receiver engagement ring. In one or more embodiments, this step comprises aligning the lugs extending distally from the outer surface of the cylindrical service jacket receiver with the receiving slots of the circumferential lug receivers defined in the cylindrical service jacket receiver engagement ring.

Next, the coupling nut is moved toward the flange of the enclosure bushing, thereby causing the lugs extending distally from the outer surface of the cylindrical service jacket receiver to pass through the receiving slots of the circumferential lug receivers defined in the cylindrical service jacket receiver engagement ring. A twist of the coupling nut at the end of this motion causes the lugs extending distally from the outer surface of the cylindrical service jacket receiver to engage with the locking notches situated at the terminal ends of the receiving slots. A weatherproof connection advantageously results.

Embodiments of the disclosure offer many advantages over prior art solutions. For example, embodiments of the disclosure provide a simplified, easier to use service cable connector system compared to the prior art threaded, multi-segment, multi-O-ring solutions. With embodiments of the disclosure, no tools are required. Nor are any specialized torque-measuring wrenches required. Moreover, embodiments of the disclosure work to prevent water ingress damage to electronic components situated within a housing or electronics enclosure by providing a quick, but robustly weatherproof, connector. What's more, embodiments of the disclosure are more reliable and less expensive to manufacture than are any of the prior art threaded, multi-segment, multi-O-ring solutions.

Thus, embodiments of the disclosure advantageously provide a tool-less, single gasket service cable coupling nut that engages with an enclosure bushing to provide robust weather protection for electronic components situated within an electronics enclosure or housing. In one or more embodiments, the coupling nut is configured with ergonomic features that are easily grasped by fingers, thereby rendering the need for tools or specialty measuring devices unnecessary. Embodiments of the disclosure provide an enclosure bushing that accepts service cables by supporting lugs, sometimes referred to as "bayonet lug features," on the outer surface of a second portion of the cylindrical service jacket receiver of the enclosure bushing. In one or more embodiments, these bayonet lug features engage and lock into one or more circumferential lug receivers defined in a cylindrical service jacket receiver engagement ring of the coupling nut.

Embodiments of the disclosure advantageously provide a single-piece, single-weather gasket and coupling nut bushing system that does not require a threaded connection for engagement, does not require tools, and eliminates "over-torque" conditions. Certain design features are included in an enclosure bushing and also in a service cable coupling nut that interlock together easily forming a system that is ergonomic requiring no tools or torque wrenches. Other advantages offered by embodiments of the disclosure will be described below. Still others will be obvious to those of ordinary skill in the art having the benefit of this disclosure.

Turning now to FIG. 1, illustrated therein is one system 100 configured in accordance with one or more embodiments of the disclosure. For illustration purposes, the system 100 used to illustrate the benefit and details of embodiments of the coupler system will include a "node" of a hybrid fiber coax or "HFC" system. By way of background, such nodes are frequently used in communications networks offering data connection services such as interactive video, telephony services, and high-speed data for Internet and World Wide Web communications. Each of these services requires fast data connections and high data bandwidths.

One way to achieve higher bandwidths for improved communications is through the use of fiber optic cables. Fiber optic cables are capable of carrying orders of magnitude more data than are older electrical connections, such as coaxial cables. Since fiber optic cable installations are expensive, it becomes cost prohibitive, using current pricing models, to fully convert the legacy coaxial cable networks serving thousands of subscribers to optical networks.

However, HFC systems allow service providers to connect end users served by coaxial cables with "head-end" or "hub" devices that deliver data through fiber optic cables in a cost effective manner. In an HFC system, centrally disposed components such as network head ends, hub devices, servers, and so forth deliver and receive data to and from the network using fiber optic cables. Termination points, i.e., customers and their corresponding client devices, are served by coaxial cables.

To bridge between the fiber optic cables and the coaxial cables, a "node" modules such as that shown in FIG. 1 can be used. This "node" is a device that receives optical signals via a fiber optic network, converts those signals to radio frequency (RF) signals, and delivers RF signals via a coaxial cable network. Accordingly, optical node modules receive data via optical fibers, convert that data to RF signals, and deliver those RF signals to legacy coaxial networks.

These nodes are frequently located in odd locations. Often, the locations are outdoors. For example, they can sometimes be hung from a ground strand in an equipment installation or equipment bunker. Such thick strand wires may also be found in yard pedestals, street cabinets, sewers, pits, basements, public areas, connected to telephone poles, and so forth. In other situations, they can be placed in a hole in the ground. In other situations, they can simply be placed near a sidewalk with a thin plastic housing covering the node.

To ensure reliability of the various amplifiers, power supplies, and other electronic components associated with a node, these electronic components are generally placed in a housing 105. Since the housing is sometimes exposed to the elements, it generally needs to be weatherproof. Frequently, these housings are configured as a "trunk," and are referred to as any of electronics enclosures, housings, trunks, or electrical equipment trunks. In one or more embodiments, the trunks are made out of aluminum. Assurance must be made that the trunk, and any connections to and from the trunk, reliably preclude the entry of water into the trunk. As noted above, water penetration of the node can cause expensive damage to the electronic components situated therein. Radio frequency amplifiers and other sensitive electronic components can quickly become damaged or unreliable in the presence of water. Advantageously, the connector described below with reference to FIG. 2 prevents this, while at the same time requiring no tools when coupling the connector to the node.

This background is presented here because while a node of an HFC network is one illustrative embodiment for which connectors configured in accordance with embodiments of the disclosure are well suited, embodiments of the disclosure are not so limited. To be sure, connectors configured in accordance with embodiments of the disclosure can be used in any number of environments where a service jacket enshrouds one or more elongated members and needs to be connected to another mechanical structure with a weatherproof coupling.

Illustrating by example, while one explanatory service jacket will be described as surrounding optical fibers (a form of electrical connection in that light is an electromagnetic wave), such as would be the case when connecting optical fibers to the electronic components of a node in an HFC network, in other embodiments the service jacket could enshroud other electrical connectors such as copper wires. In still other embodiments, the service jacket could enshroud a purely mechanical connector, such as an organic or inorganic rope. Of course, combinations of these could be used as well. A service jacket could enshroud a combination of optical fibers, other electrical connectors, and/or mechanical elements. Still other embodiments will be obvious to those of ordinary skill in the art having the benefit of this disclosure. Thus, while coupling optical fibers to a node of an HFC network is one explanatory application, it is not the only application to which embodiments of the disclosure are well suited.

In one or more embodiments, the system 100 of FIG. 1 includes one or more electronic components situated within a housing 105 or electrical equipment trunk. In one or more embodiments, the housing is configured as a "trunk" and includes a base 106 and a lid 107. The lid 107 is pivotably coupled to the base by one or more hinges 108,109. The electronic components situated within the housing can include power supplies, RF amplifiers, power distribution boards, fiber optic receiver modules, digital transmitters, or other associated components.

In one or more embodiments, both the lid 107 and the base 106 includes one or more apertures 110,111,112,114,115 configured as physical "ports" through which electrical connections to the various electronic components, including those made by fiber optic fibers, can be made from exterior of the housing 105.

In the illustrative embodiment of FIG. 1, the illustrative electronic components include a quad-output amplifier module 101, a power supply 102 operable with the quad-output amplifier module 101, a control board 103, and a node/amplifier determination module 104. In one or more embodiments, these electronic components are placed within a housing 105 that includes a lid 107 and a base 106.

In the illustrative embodiment of FIG. 1, the housing 105 resembles a vintage luggage trunk, and for this reason is sometimes referred to as a "trunk" or "electrical equipment trunk." In this illustrative embodiment, each of the quad-output amplifier module 101, the power supply 102, the control board 103, and the node/amplifier determination module 104 are placed in either the lid 107 or the base 106 of the housing 105, just as one would pack a vintage luggage trunk with clothes or other objects. The trunk can be manufactured from metal, such as aluminum, in one or more embodiments. In other embodiments, the trunk can be manufactured from other materials, including thermoplastics, steel, or composite materials.

In this illustrative embodiment, a first portion of the housing 105 defines the base 106 of the housing 105, while a second portion defines the lid 107 of the housing 105. Note that as shown in FIG. 1, the base 106 is disposed above the lid 107. It should be noted that this is the convention that will be used herein, namely, the bottom, deeper portion is the lid 107 and the upper, shallower portion is the base 106.

In one or more embodiments, the base 106 and lid 107 are pivotably coupled together by one or more hinges 108,109. This allows the housing 105 can be closed to define a weatherproof housing for convenient, and watertight, deployment in the field. While hinges 108,109 are shown as an illustrative embodiment, in other embodiments the base 106 and lid 107 may simply be bolted together without any hinged connection. Other techniques for coupling the base 106 and lid 107 will be obvious to those of ordinary skill in the art having the benefit of this disclosure.

In one embodiment, the base 106 of the housing 105 includes one or more apertures 110,111,112 through which input and/or output cables can pass to couple to the electronic components disposed within the housing 105. Similarly, the lid 107 of the housing 105 can include one or more apertures 114,115 through which cables can be coupled to the internal components of the housing 105. In one embodiment, these apertures 110,111,112 are mechanical "ports" through which fiber optic cables, coaxial cables, and other cables can pass to make electrical connections with the electronic components from exterior of the housing 105. Where these ports are not used, they can be sealed to make the housing 105 weatherproof.

In one illustrative embodiment, the quad-output amplifier module 101 is disposed in the base 106 of the housing 105. The power supply 102, control board 103, and node/amplifier determination module 104 are disposed in the lid 107 of the housing 105. Those of ordinary skill in the art having the benefit of this disclosure will understand that other configurations may be more suitable for other applications. For example, the quad-output amplifier module 101 is disposed in the lid 107 of the housing 105, while the power supply 102, control board 103, and node/amplifier determination module 104 are disposed in the base 106 of the housing 105 and so forth. Moreover, in other applications, components other than, or in addition to, the quad-output amplifier module 101, the power supply 102, control board 103, and node/amplifier determination module 104 will be included in the housing. Thus, it should be noted that these components are illustrative only, as numerous others suitable for inclusion in the housing 105 will be obvious to those of ordinary skill in the art having the benefit of this disclosure.

In one embodiment, one or more electrical connectors 117 couple electronic components situated within the base 106 to the electronic components situated in the lid 107. In this illustrative embodiment, the one or more electrical connectors 117 couple the quad-output amplifier module 101 to the control board 103, which is electronically coupled to the node/amplifier determination module 104. Other connectors may provide power to the node/amplifier determination module 104. The control board 103 may include one or more connectors to which a corresponding connector may be attached. In one embodiment, each connector may be coupled to an external power source. Power source connectors may be disposed along the housing 105 so that cables from external power sources may be attached in one or more embodiments.

It should be noted once again that the system 100 of FIG. 1 is being used for illustrative purposes only, as an HFC network module is well suited to benefit from embodiments of the disclosure. However, those of ordinary skill in the art having the benefit of this disclosure will appreciate that embodiments of the disclosure can be applied to other components as well. Accordingly, the embodiment of FIG. 1 is not intended to limit the scope of the claims below.

Figure 2:
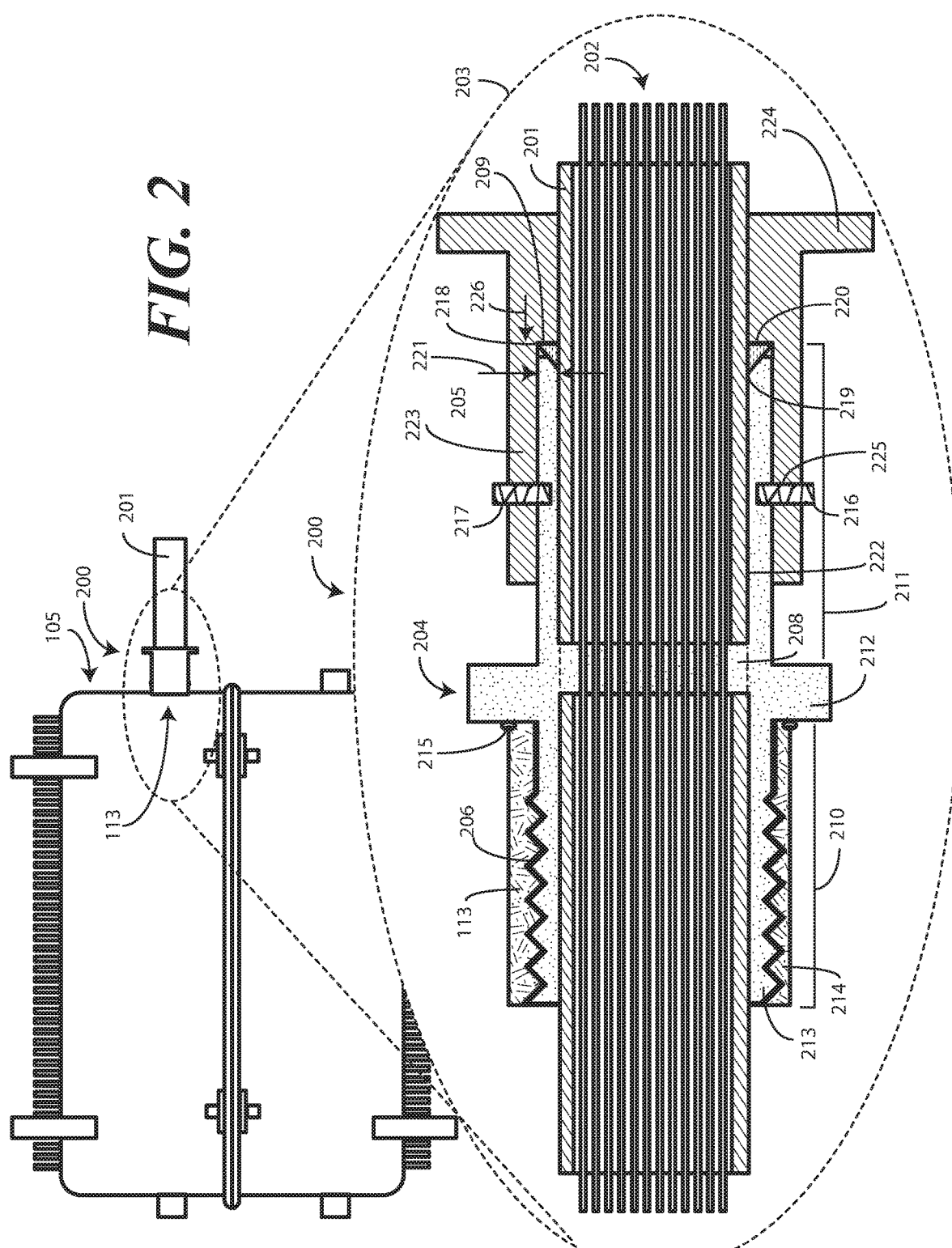
FIG. 2 illustrates one explanatory connector in accordance with one or more embodiments of the disclosure.

Turning now to FIG. 2, illustrated therein is one explanatory connector 200 configured in accordance with one or more embodiments of the disclosure. To better illustrate the various components and features of the connector 200, the connector 200 is shown in a sectional view 203 in FIG. 2. Each individual component of the connector 200 will be described in further detail below with reference to FIGS. 3-19.

The illustrative connector 200 of FIG. 2 is used to couple a service jacket 201 enshrouding one or more elongated items to a port 113 of the housing 105, thereby allowing the one or more elongated items to pass through the port 113 into the housing 105. More specifically, in the illustrative embodiment of FIG. 2 the connector 200 couples a service jacket 201, through which one or more objects pass from an exterior of the housing 105 to an interior of the housing 105, to a port 113 of the housing 105. As noted above, the objects passing through the service jacket 201 could be any of a number of items, examples of which include wires, optical fibers, or mechanical supports. Other items that may pass through the service jacket 201 will be obvious to those of ordinary skill in the art having the benefit of this disclosure.

In the illustrative embodiment of FIG. 2, a plurality of optical fibers 202 passes through the service jacket 201 and the connector 200 into a port (113) of the housing 105. In this embodiment, the plurality of optical fibers 202 is situated within, and enshrouded by, the service jacket 201. The plurality of optical fibers 202 of this embodiment pass from the exterior of the housing 105, through the lumen 208 defined by the cylindrical service jacket receiver 207 of the enclosure bushing 204, and into the housing 105.

The number of optical fibers 202 can vary based on application. For example, in various embodiments the number of optical fibers 202 passing through the service jacket 201 can be 1, 2, 4, 6, 8, 25, 38, or more optical fibers. In one or more embodiments, these optical fibers 202 can couple to electronic components disposed within the housing 105, such as the fiber optic receiver modules, fiber optic transmitter modules, fiber optic amplifiers, and other associated components.

As best shown in the sectional view 203 of FIG. 2, in one or more embodiments the connector 200 comprises an enclosure bushing 204 and a coupling nut 205. In one or more embodiments, the enclosure bushing 204 and the coupling nut 205 can be manufactured out of metal, such as aluminum or brass. In other embodiments, the enclosure bushing 204 and coupling nut 205 can be manufactured from plastic. Other materials suitable for manufacturing the enclosure bushing 204 and coupling nut 205 will be obvious to those of ordinary skill in the art having the benefit of this disclosure. In the illustrative embodiment of FIG. 2, the enclosure bushing 204 is coupled to a port 113 of the housing 105.

In one or more embodiments, the enclosure bushing 204 comprises a cylindrical service jacket receiver 207. In one or more embodiments, the cylindrical service jacket receiver 207 defines a lumen 208 through which one or more electrical conductors, e.g., optical fibers 202, or other long, thin objects, e.g., mechanical wires, supports, or components, may pass to make electrical connections to the electrical components disposed within the housing 105 from the exterior of the housing 105. In the illustrative embodiment of FIG. 2, a plurality of optical fibers 202 is enshrouded in a service jacket 201 until the optical fibers 202 reach the interior of the enclosure bushing 204, where they spread and separate to couple to electronic components. In one or more embodiments, the combination of service jacket 201 and optical fibers 202 define a service cable. The length of the service cable can vary, with some service cables being between ten and thirty meters in length.

In one or more embodiments, the cylindrical service jacket receiver 207 defines a first portion 210 and a second portion 211. In the illustrative embodiment of FIG. 2, a flange 212 separates the first portion 210 and the second portion 211.

As shown in FIG. 2, in one or more embodiments the first portion 210 extends into, and couples to, a port 113 of the housing 105. In this illustrative embodiment, the first portion 210 comprises a threaded end 213. In one or more embodiments, the threaded end 213 screws into complementary threads 214 situated within the port 113 and defining a threaded receiver of the port 113. Said differently, in this illustrative embodiment the first portion 210 of the cylindrical service jacket receiver 207 comprises a plurality of threads engaging a plurality of complementary threads 214 of the threaded receiver of the port 113.

In one or more embodiments, the enclosure bushing 204 is perdurably coupled to the port 113 by a potting adhesive 206. In one or more embodiments, the potting adhesive 206 perdurably retains the enclosure bushing 204 in a fixed configuration within the port 113 of the housing 105 by fixedly cementing the threaded end 213 to the complementary threads 214 situated within the port 113 of the housing 105.

In one or more embodiments, the threaded end 213 is perdurably coupled to the complementary threads 214 in the factory prior to the housing 105 being delivered to the field. Accordingly, when the housing 105 is deployed in the field, the enclosure bushing 204 is fixedly coupled to the housing such that the two effectively function as a single piece, with the second portion 211 of the cylindrical service jacket receiver 207 extending distally from the port 113 and the side of the housing 105.

Illustrating by example, in one or more embodiments when the housing 105 is being constructed in the factory, the threaded end 213 of the cylindrical service jacket receiver 207 can be perdurably coupled to the port 113 with a potting adhesive 206 or other perdurable adhesive that is placed between the threaded end 213 of the cylindrical service jacket receiver 207 and the threaded receiver of the port 113 defined by the complementary threads 214. Thus, during manufacture the cylindrical service jacket receiver 207 becomes an integral part of the housing 105. When the housing 105 is then delivered to the field, the cylindrical service jacket receiver 207 is fixed within the port 113 as if it were a unitary portion of the housing 105, and will not rotate within the complementary threads 214 relative to the housing 105.

In one or more embodiments, the flange 212 of the enclosure bushing 204 abuts the housing 105 when the threaded end 213 of the cylindrical service jacket receiver 207 is fully inserted into the threaded receiver of the port 113 of the housing 105 defined by the complementary threads 214. In the illustrative embodiment of FIG. 2, when the threaded end 213 of the cylindrical service jacket receiver 207 is fully inserted into the threaded receiver of the port 113 of the housing 105 defined by the complementary threads 214, the second portion 211 of the cylindrical service jacket receiver 207 extends distally away from both the flange 212 and the housing 105.

In one or more embodiments, an optional toroidal weather gasket 215 can be positioned between the housing 105 and the flange 212. In one or more embodiments, the toroidal weather gasket 215 is coupled to the first portion 210 of the cylindrical service jacket receiver 207. In the illustrative embodiment of FIG. 2, the optional toroidal weather gasket 215 is coupled to an outer surface of the first portion 210 of the cylindrical service jacket receiver 207. In one or more embodiments, the optional toroidal weather gasket 215 is manufactured from a compressible material such as silicone rubber. Other compressible materials suitable for manufacturing the optional toroidal weather gasket 215 will be obvious to those of ordinary skill in the art having the benefit of this disclosure.

In the illustrative embodiment of FIG. 2, the optional toroidal weather gasket 215 is situated between the flange 212 and the portion of the housing 105 located at the port 113 that abuts the flange 212. Despite the fact that the engagement of the threaded end 213 of the cylindrical service jacket receiver 207 with the complementary threads 214 provides a weatherproof seal, especially when the potting adhesive 206 is disposed therebetween to perdurably couple the two together, the inclusion of the optional toroidal weather gasket 215 provides additional insurance that this weatherproof seal will not be compromised.

In one or more embodiments, the second portion 211 of the cylindrical service jacket receiver 207 supports one or more lugs 216,217. As shown in FIG. 2, the one or more lugs 216,217 extend distally away from an outer surface of the second portion 211 of the cylindrical service jacket receiver 207. In one or more embodiments, each lug of the one or more lugs 216,217 has a circular cross section, as will be shown in FIG. 4 below.

While two lugs 216,217 are shown in the sectional view 203 of FIG. 2 due to the fact that the cylindrical service jacket receiver 207 is shown in section, it should be noted that the second portion 211 of the cylindrical service jacket receiver 207 can support one, two, three, four, or more lugs in various embodiments. Illustrating by example, as will be shown in FIGS. 3-5 below, in one or more embodiments the cylindrical service jacket receiver 207 supports four lugs. Other numbers of lugs to include along the cylindrical service jacket receiver 207 will be obvious to those of ordinary skill in the art having the benefit of this disclosure.

In one or more embodiments, a frustoconical weather gasket 218 is coupled to, and circumscribes, the service jacket 201. While a frustoconical weather gasket 218 is used as an illustrative example to describe embodiments of the disclosure, it should be noted that weather gaskets having other cross-sectional shapes can be used as well. Illustrating by example, in another embodiment the frustoconical weather gasket 218 can be replaced by a weather gasket having a square cross section. In another embodiment, the frustoconical weather gasket 218 can be replaced by a weather gasket having a circular cross section. In still another embodiment, the frustoconical weather gasket 218 can be replaced by a gasket having an annular, disk shape. Other cross-sectional shapes for weather gaskets that can be substituted for the frustoconical weather gasket 218 will be obvious to those of ordinary skill in the art having the benefit of this disclosure.

In one or more embodiments, the frustoconical weather gasket 218 is manufactured from a compressible material such as silicone rubber. However, as with the optional toroidal weather gasket 215, other compressible material suitable for manufacturing the frustoconical weather gasket 218 will be obvious to those of ordinary skill in the art having the benefit of this disclosure.

In one embodiment, the frustoconical weather gasket 218 comprises an integral component of the coupling nut 205. Illustrating by example, in one or more embodiments the frustoconical weather gasket 218 can be adhesively affixed to a compression plate (802) of the coupling nut 205, which is described in more detail with reference to FIG. 8 below. In another embodiment, the frustoconical weather gasket 218 can be snap fit within an interior of the coupling nut 205. In still another embodiment, the frustoconical weather gasket 218 can be frictionally coupled to the interior of the coupling nut 205. Other techniques for fixedly attaching the frustoconical weather gasket 218 to the interior of the coupling nut 205 will be obvious to those of ordinary skill in the art having the benefit of this disclosure.

In other embodiments, the frustoconical weather gasket 218 can be a separate component and can be attached to the service jacket 201 independently of the coupling nut 205.

Where this is the case, the frustoconical weather gasket 218 can be coupled to the service jacket 201 in a variety of ways. Illustrating by example, in one embodiment the frustoconical weather gasket 218 can be adhesively coupled to the exterior surface of the service jacket 201. In another embodiment, the frustoconical weather gasket 218 can be thermally coupled to the exterior surface of the service jacket 201. In many embodiments, especially where the frustoconical weather gasket 218 is manufactured from a compressible material such as silicone rubber, the frustoconical weather gasket 218 will simply be placed about the service jacket 201 with friction between the frustoconical weather gasket 218 and the service jacket 201 retaining the frustoconical weather gasket 218 in place. Other techniques for coupling the frustoconical weather gasket 218 to the service jacket 201 will be obvious to those of ordinary skill in the art having the benefit of this disclosure.

In the illustrative embodiment of FIG. 2, a narrower end 219 of the frustoconical weather gasket 218 is positioned between a distal end 209 of the second portion 211 of the cylindrical service jacket receiver 207 and a wider end 220 of the frustoconical weather gasket 218. In one or more embodiments, a diameter 221 of an interior surface 222 of the second portion 211 of the cylindrical service jacket receiver 207 becomes wider at the distal end 209 of the second portion 211 of the cylindrical service jacket receiver 207 so as to define a frustoconical weather gasket receiver into which the frustoconical weather gasket 218 seats. This frustoconical weather gasket receiver will be shown in more detail below with reference to FIG. 4.

As shown in FIG. 2, the service jacket 201 is inserted into the second portion 211 of the cylindrical service jacket receiver 207. In this illustrative embodiment, the service jacket 201 is inserted into the lumen 208 of the second portion 211 of the cylindrical service jacket receiver 207.

Where the frustoconical weather gasket 218 is integrally coupled to the coupling nut 205, the frustoconical weather gasket 218 can frictionally attach to the service jacket 201 simply by sliding the coupling nut 205 around the service jacket 201. However, where the frustoconical weather gasket 218 and coupling nut 205 are separate components, in one or more embodiments prior to coupling the frustoconical weather gasket 218 to the service jacket 201, the coupling nut 205 is placed about the service jacket 201 such that it is able to translate along the outer surface of the service jacket 201. In either configuration, once applied to the service jacket 201, the coupling nut 205 encircles the service jacket 201.

In one or more embodiments, the coupling nut 205 comprises a cylindrical service jacket receiver engagement ring 223 extending distally from a disc grip 224. In one or more embodiments, the cylindrical service jacket receiver engagement ring 223 defines one or more circumferential lug receivers, which will be shown in more detail below with reference to FIG. 7. In one or more embodiments, each circumferential lug receiver comprises a receiving slot and a locking notch 225, which is situated at a terminal end of the receiving slot.

In one or more embodiments, either when the coupling nut 205 with its integrally coupled frustoconical weather gasket 218 is applied to the service jacket 201, or alternatively after the frustoconical weather gasket 218 is placed about the service jacket 201 where the frustoconical weather gasket 218 and coupling nut 205 are separate components, the coupling nut 205 passes about the frustoconical weather gasket 218 and engages the cylindrical service jacket receiver 207 of the enclosure bushing 204. In one or more embodiments, the one or more lugs 216,217 extending from the outer surface of the second portion 211 of the cylindrical service jacket receiver 207 insert into the receiving slots of the cylindrical service jacket receiver engagement ring 223 of the coupling nut 205, ultimately seating within the locking notches 225.

In one or more embodiments, when this occurs, the coupling nut 205 applies a compression force 226 to the frustoconical weather gasket 218. In one or more embodiments, this compression force 226 causes the frustoconical weather gasket 218 to compress between an interior base surface of the coupling nut 205 and the distal end 209 of the second portion 211 of the cylindrical service jacket receiver 207 of the enclosure bushing 204. This compression of the frustoconical weather gasket 218 ensures a weather tight seal between the service jacket 201 and the cylindrical service jacket receiver 207. This is due to the fact that the frustoconical weather gasket 218 becomes compressed, and thereby expands between the service jacket 201 and the cylindrical service jacket receiver 207 to fill any voids therebetween.

Advantageously, attaching the coupling nut 205 to the enclosure bushing 204 to create this weatherproof seal between the service jacket 201 and the cylindrical service jacket receiver 207 with the frustoconical weather gasket 218 can be performed using only a single hand in one or more embodiments. Accordingly, the process does not require any special tools or torque-sensing wrenches.

In one or more embodiments, to couple the service cable to the housing 105 using the connector 200 of FIG. 2, the plurality of optical fibers 202 are inserted through the lumen 208 defined by the cylindrical service jacket receive 207 of the enclosure bushing 204, and thus through the port 113 of the housing 105. As necessary, these optical fibers 202 can be coupled to electronic components, such as those described above with reference to FIG. 1, which are disposed within the housing 105. For example, in one or more embodiments each optical fiber of the plurality of optical fibers 202 can be coupled to optical fiber receiving modules situated within the housing 105.

Next, or concurrently with this first step, the service jacket 201 is inserted into the distal end 209 of the second portion 211 of the cylindrical service jacket receiver 207 of the enclosure bushing 204. In one or more embodiments, the service jacket 201 is inserted into the second portion 211 of the cylindrical service jacket receiver 207 until the frustoconical weather gasket 218 abuts the distal end 209 of the second portion 211 of the cylindrical service jacket receiver 207 of the enclosure bushing 204.

Next, the coupling nut 205 is aligned with the cylindrical service jacket receiver 207 such that the lugs 216,217 extending distally from the outer surface of the cylindrical service jacket receiver 207 align with the circumferential lug receivers defined in the cylindrical service jacket receiver engagement ring 223. In one or more embodiments, the lugs 216,217 are aligned with the receiving slots of the circumferential lug receivers defined in the cylindrical service jacket receiver engagement ring 223.

Next, the coupling nut 205 is moved toward the flange 212 of the enclosure bushing 204, thereby causing the lugs 216,217 extending distally from the outer surface of the cylindrical service jacket receiver 207 to pass into and through the receiving slots of the circumferential lug receivers defined in the cylindrical service jacket receiver engagement ring 223. A twist of the coupling nut 205 at the end of this motion, e.g., a one-quarter turn of the disc grip 224 of the coupling nut 205 in one or more embodiments, causes the lugs 216,217 to engage with the locking notches situated at the terminal ends of the receiving slots. A weatherproof connection advantageously results.

Thus, as shown and described above, FIG. 2 illustrates a system including an electrical equipment trunk, which is shown as housing 105 in FIG. 2. In one or more embodiments, the housing defines at least one port 113. In this illustrative embodiment, the port 113 comprises one or more complementary threads 214 defining a threaded receiver. In one or more embodiments, exterior equipment can be coupled to electrical equipment situated within the housing 105 by passing, for example, a plurality of optical fibers 202 coupled to the exterior equipment through the port 113.

In one or more embodiments, the enclosure bushing 204, which includes a first portion 210 comprising one or more threads at the threaded end 213, thereby defining a threaded bushing, it coupled to the port 113. In one or more embodiments, as described above, the first portion 210 of the enclosure bushing 204 is perdurably coupled to the port 113. The enclosure bushing 204 comprises a flange 212, with a second portion 211 of the cylindrical service jacket receiver 207 extending distally away from the flange 212. One or more lugs 216,217 extend distally from an exterior surface of the cylindrical service jacket receiver 207.

As shown above, a service jacket 201 is inserted into the cylindrical service jacket receiver 207 with a weather gasket, shown illustratively as frustoconical weather gasket 218 in FIG. 2, circumscribing the service jacket 201. In one or more embodiments, the frustoconical weather gasket 218 abuts the cylindrical service jacket receiver 207. In one or more embodiments, the frustoconical weather gasket 218 is adhesively or otherwise integrally coupled to the interior of the coupling nut 205 such that the frustoconical weather gasket 218 and coupling nut 205 define a unitary part. In other embodiments, the frustoconical weather gasket 218 is a separate component from the coupling nut 205.

In one or more embodiments, the coupling nut 205 defines a plurality of lug receivers that engage the plurality of lugs 216,217. In one or more embodiments, the plurality of lug receivers then engage the plurality of lugs 216,217 on a one-to-one basis. This will be illustrated below with reference to FIG. 25. When the lugs 216,217 are seated in locking notches situated at terminal ends of the receiving slots, the coupling nut 205 compresses the frustoconical weather gasket 218 against the cylindrical service jacket receiver 207 to create a watertight seal.

Figure 3:
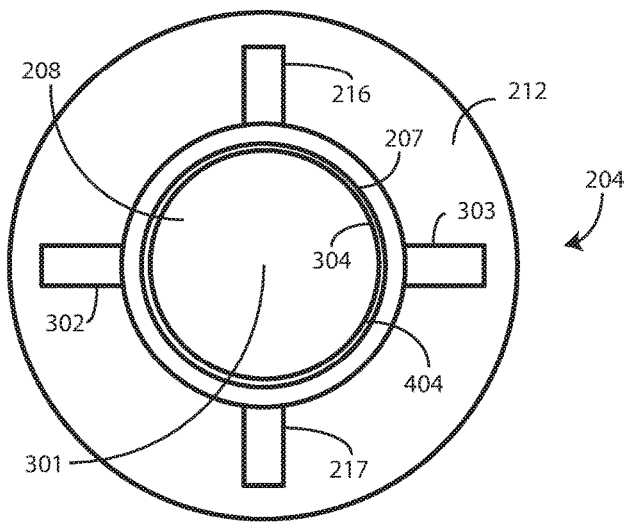
FIG. 3 illustrates a front elevation view of one explanatory enclosure bushing in accordance with one or more embodiments of the disclosure.
Figure 4:
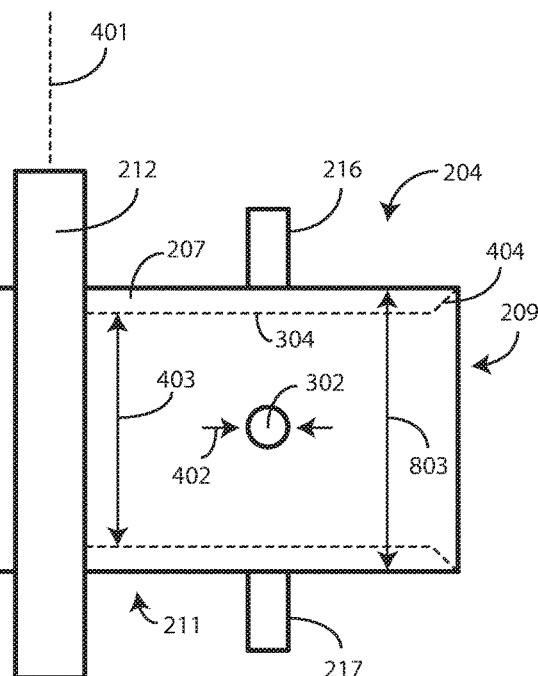
FIG. 4 illustrates a side elevation view of one explanatory enclosure bushing in accordance with one or more embodiments of the disclosure.
Figure 5:
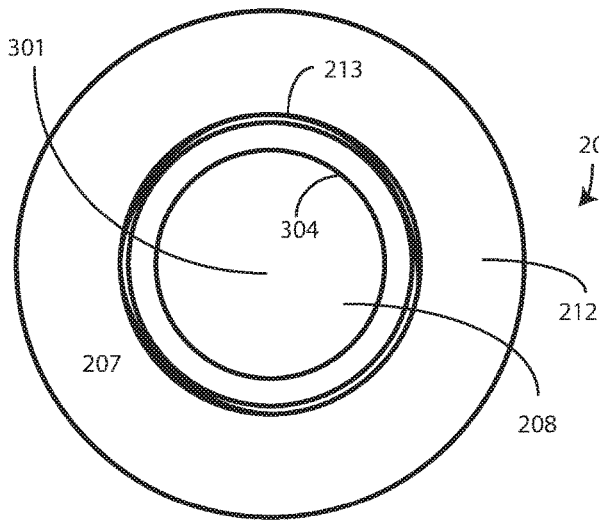
FIG. 5 illustrates a rear elevation view of one explanatory enclosure bushing in accordance with one or more embodiments of the disclosure.

Turning now to FIGS. 3-5, illustrated therein is one explanatory enclosure bushing 204 configured in accordance with one or more embodiments of the disclosure. FIG. 3 illustrates a front elevation view of the enclosure bushing 204, while FIG. 4 illustrates a side elevation view of the enclosure bushing 204. FIG. 5 illustrates a rear elevation view of the enclosure bushing 204. As noted above, in one or more embodiments the enclosure bushing 204 is manufactured from a metal, such as brass or aluminum. However, other materials suitable for manufacturing the enclosure bushing 204 will be obvious to those of ordinary skill in the art having the benefit of this disclosure.

As shown in FIGS. 3-5, in one or more embodiments the enclosure bushing 204 comprises a cylindrical service jacket receiver 207. In one or more embodiments, the cylindrical service jacket receiver 207 defines a lumen 208. In one or more embodiments, the lumen 208 is centrally aligned within the cylindrical service jacket receiver 207 along a major axis 301. As described above, electrical connections, be they in the form of optical fibers, wires, or other structures, can pass through the lumen 208 to couple electrical components situated on one side of the cylindrical service jacket receiver 207 to other electrical components situated on the other side of the cylindrical service jacket receiver 207.

In one or more embodiments, the enclosure bushing 204 also comprises a flange 212. As best shown in FIGS. 3 and 5, in this illustrative embodiment the flange 212 has a circular cross section. However, in other embodiments the cross section of the flange 212 will take other shapes. For instance, the flange 212 can have a triangular cross section, a rectangular cross section, a polygonal cross section, an ovular cross section, or a free-form cross section in other embodiments.

In this illustrative embodiment, the flange 212 is centrally disposed along a medial axis 401 of the cylindrical service jacket receiver 207. In this embodiment, the flange 212 extends distally from an outer surface of the cylindrical service jacket receiver 207 at an angle that is orthogonal with the outer surface of the cylindrical service jacket receiver 207.

In one or more embodiments, the cylindrical service jacket receiver 207 defines a first portion 210 extending distally from a first side of the flange 212, and a second portion 211 extending distally from a second side of the flange 212. One or more lugs 216,217,302,303 extend distally away from the exterior surface of the second portion 211 of the cylindrical service jacket receiver 207. These lugs 216,217,302,303 are sometimes referred to as "bayonet" lugs.

In this illustrative embodiment, four lugs 216,217,302, 303 extend distally away from the outer surface of the second portion 211 of the cylindrical service jacket receiver 207. However, as noted above, in other embodiments fewer than four lugs will extend distally away from the outer surface of the second portion 211 of the cylindrical service jacket receiver 207. In still other embodiments, more than four lugs will extend distally away from the outer surface of the second portion 211 of the cylindrical service jacket receiver 207.

In this illustrative embodiment, each lug 216,217,302,303 has a cylindrical cross section 402 across a minor axis. However, in other embodiments the cross sections of the lugs 216,217,302,303 can take other shapes, as will be obvious to those of ordinary skill in the art having the benefit of this disclosure.

In one or more embodiments, the first portion 210 of the cylindrical service jacket receiver 207 comprises a plurality of threads at a threaded end 213. As previously described, in one or more embodiments the plurality of threads at a threaded end 213 can engage a plurality of complementary threads (214) of at least one port (113) of a housing (105) or trunk to retain the enclosure bushing 204 within the port (113) with a water tight seal.

As shown in the illustrative embodiment of FIGS. 3-5, in one or more embodiments a diameter 403 of the interior surface 304 of the second portion 211 of the cylindrical service jacket receiver 207 can become wider at a distal end 209 of the second portion 211 of the cylindrical service jacket receiver 207. In so doing, in one or more embodiments the distal end 209 of the second portion 211 of the cylindrical service jacket receiver 207 defines a frustoconical weather gasket receiver 404. In one or more embodiments, a frustoconical weather gasket can seat within the frustoconical weather gasket receiver 404 when the enclosure bushing 204 is in use.

Figure 6:
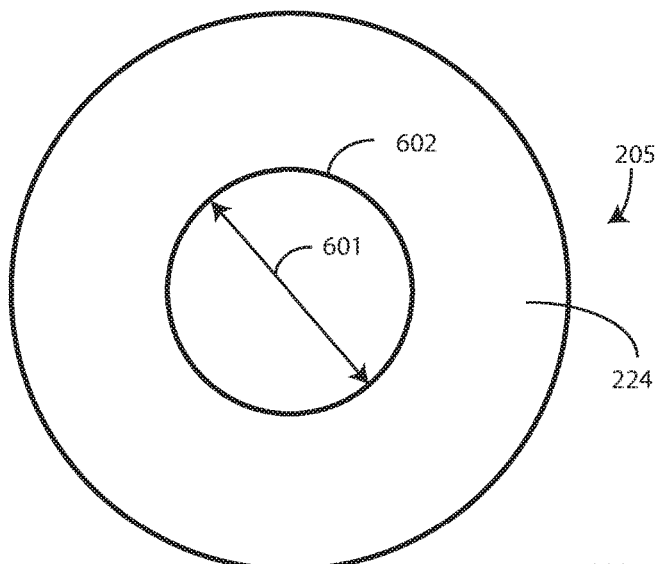
FIG. 6 illustrates a rear elevation view of one explanatory coupling nut in accordance with one or more embodiments of the disclosure.
Figure 7:
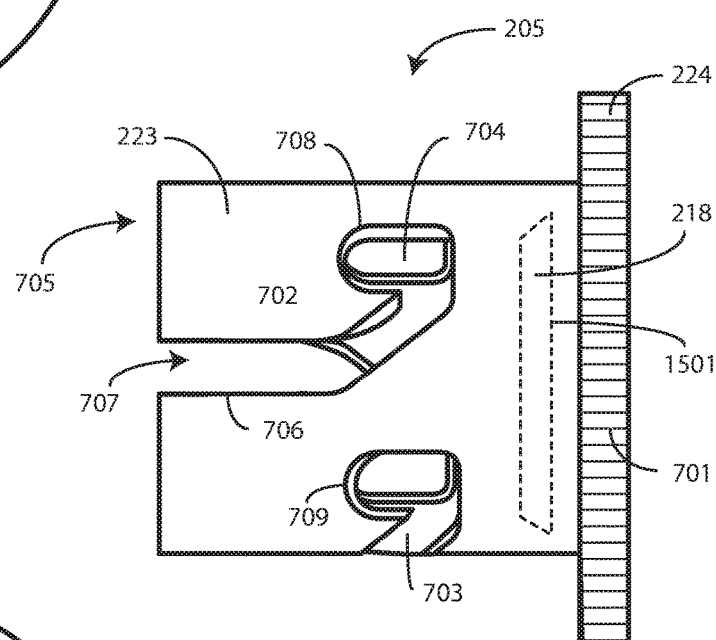
FIG. 7 illustrates a side elevation view of one explanatory coupling nut in accordance with one or more embodiments of the disclosure.
Figure 8:
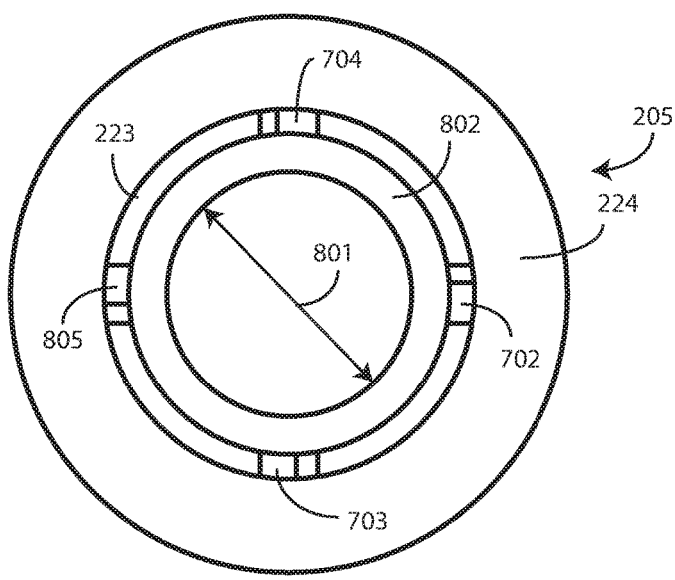
FIG. 8 illustrates a front elevation view of one explanatory coupling nut in accordance with one or more embodiments of the disclosure.

Turning now to FIGS. 6-8, illustrated therein is one explanatory coupling nut 205 configured in accordance with one or more embodiments of the disclosure. FIG. 6 illustrates a rear elevation view of the coupling nut 205, while FIG. 7 illustrates a side elevation view of the coupling nut 205. FIG. 8 illustrates a front elevation view of the coupling nut 205. As noted above, in one or more embodiments the coupling nut 205 is manufactured from a metal, such as brass or aluminum. However, other materials suitable for manufacturing the coupling nut 205 will be obvious to those of ordinary skill in the art having the benefit of this disclosure.

In one or more embodiments, the coupling nut 205 comprises a cylindrical service jacket receiver engagement ring 223 extending distally from a disc grip 224. In this illustrative embodiment, the disc grip 224 comprises one or more optional ridges or other surface features 701 disposed about an edge of the disc grip 224. Where included, the optional ridges or other surface features 701 can provide a frictional surface against which a user's fingers may rest to make twisting and turning the coupling nut 205 easier. In other embodiments, the optional ridges or surface features 701 will be omitted.

Turning briefly to FIGS. 9-11, illustrated therein are alternate coupling nuts 900,1000,1100 that include different grips 924,1024,1124. Each grip 924,1024,1124 is configured so as to be ergonomically easy for a person to twist with a hand, thereby compressing any weather gaskets situated within the cylindrical service jacket receiver engagement rings 923,1023,1123.

Beginning with FIG. 9, in this illustrative embodiment the grip 924 includes one or more angular protrusions 901,902, 903, with each angular protrusion 901,902,903 being separated by an angular recess 904,905,906. The alternating angular protrusions 901,902,903 and angular recesses 904, 905,906 create a ridged perimeter of the grip 924 that is easy to grasp and turn.

Turning now to FIG. 10, illustrated therein is another grip 1024. In this embodiment, the perimeter of the grip 1024 includes one or more lobes 1001,1002,1003,1004, with each lobe having a flower petal appearance. While four lobes 1001,1002,1003,1004 are shown in the illustrative embodiment of FIG. 10, in other embodiments the grip 1024 can have more than four lobes or fewer than four lobes. The lobes 1001,1002,1003,1004 create a scalloped perimeter of the grip 1024 that is easy to grasp and turn.

Turning now to FIG. 11, illustrated therein is yet another grip 1124. In this illustrative embodiment, the perimeter of the grip comprises one or more convex curved protrusions 1101,1102,1103 interspaced by one or more concave curved recesses 1104,1105,1106. The alternating convex curved protrusions 1101,1102,1103 and concave curved recesses 1104,1105,1106 create a ridged perimeter of the grip 1124 that is easy to grasp and turn.

It should be noted that FIGS. 9-11 provide only a sample of the various ways in which a perimeter of a grip can be configured for ergonomic efficiency in accordance with embodiments of the disclosure. Others will be obvious to those of ordinary skill in the art having the benefit of this disclosure.

Turning now back to FIG. 7, in one or more embodiments the cylindrical service jacket receiver engagement ring 223 defines one or more circumferential lug receivers 702,703, 704,805. In the illustrative embodiment of FIGS. 6-8, each circumferential lug receiver 702,703,704,805 includes a slot opening 707 situated at a distal end 705 of the cylindrical service jacket receiver engagement ring 223 located distally from the disc grip 224. From this slot opening 707, each circumferential lug receiver 702,703,704,805 comprises a curvilinear receiving slot, one example of which is curvilinear receiving slot 706.

In the illustrative embodiment of FIGS. 6-8, the curvilinear receiving slot 706 comprises a first substantially linear section and a second substantially linear section, with those substantially linear sections joining to define a curvilinear receiving slot angle of about one hundred and fifty degrees. However, this is but one configuration for the curvilinear receiving slot 706. In other embodiments, the curvilinear receiving slot 706 can comprise a substantially linear section extending to an arched section, thereby defining a candycane shape. In another embodiment, the curvilinear receiving slot 706 comprises a substantially linear section extending to a half-arched section, thereby resembling a candycane shape broken at the apex of the arch. In still another embodiment, the curvilinear receiving slot 706 will have three or more substantially linear sections or substantially arched sections. Other configurations for the curvilinear receiving slot 706 will be obvious to those of ordinary skill in the art having the benefit of this disclosure.

In one or more embodiments, each curvilinear receiving slot 706 extends from the slot opening to a locking notch, e.g., locking notches 708,709. In the illustrative embodiment of FIGS. 6-8, each locking notch 708,709 is situated at a terminal end of the curvilinear receiving slot 706.

In one or more embodiments, each curvilinear receiving slot 706 is configured to receive a lug (216,217,303,303) extending from a cylindrical service jacket receiver (207) of an enclosure bushing (204). Accordingly, in one or more embodiments the diameter of each curvilinear receiving slot 706 is greater than the diameter of each lug (216,217,303, 303) extending from the cylindrical service jacket receiver (207) to which the coupling nut 205 will be coupled.

Additionally, in one or more embodiments the cylindrical service jacket receiver engagement ring 223 is configured to slide around the second portion (211) of the cylindrical service jacket receiver (207) to which the coupling nut 205 will be coupled. Accordingly, in one or more embodiments the interior diameter 801 of the cylindrical service jacket receiver engagement ring 223 is greater than the external diameter (803) of the second portion (211) of the cylindrical service jacket receiver (207) to which the coupling nut 205 will be coupled.

As described above, in one or more embodiments when the coupling nut 205 is coupled to the the second portion (211) of the cylindrical service jacket receiver (207), the slot openings 707 of the circumferential lug receivers 702,703, 704,805 are initially aligned with the lugs (216,217,303, 303) extending from the cylindrical service jacket receiver (207). The coupling nut 205 is then translated along the second portion (211) of the cylindrical service jacket receiver (207) toward the flange (212), thereby causing the lugs (216,217,303,303) extending from the cylindrical service jacket receiver (207) to translate along the curvilinear receiving slots 706 toward the disc grip 224 of the coupling nut 205.

As the lugs (216,217,303,303) extending from the cylindrical service jacket receiver (207) reach the curvilinear receiving slot angle of the first substantially linear section and the second substantially linear section, a gentle twist counterclockwise of the disc grip 224 allows the lugs (216,217,303,303) extending from the cylindrical service jacket receiver (207) to translate up the second substantially linear section. Once the lugs (216,217,303,303) extending from the cylindrical service jacket receiver (207) reach the end of the second substantially linear section, a final twist causes the lugs (216,217,303,303) extending from the cylindrical service jacket receiver (207) to seat within the locking notches 708,709.

In one or more embodiments, this causes the coupling nut 205 to apply a compression force to a frustoconical weather gasket (218) as previously described. Where, for example, the cylindrical service jacket receiver (207) includes a complementary frustoconical weather gasket receiver (404), in one or more embodiments the coupling nut 205 compresses the frustoconical weather gasket (218) against the complementary frustoconical weather gasket receiver (404), and so forth.

In one or more embodiments, for this to occur the coupling nut 205 begins applying the compression force to the frustoconical weather gasket (218) when the lugs (216, 217,303,303) extending from the cylindrical service jacket receiver (207) are within the curvilinear receiving slots 706. In one or more embodiments, to apply this compression force, the interior diameter 801 of the cylindrical service jacket receiver engagement ring 223 is greater than the interior diameter 601 of the aperture 602 in the disc grip 224 through which the service jacket (201) passes. This difference in diameter lengths results in a compression plate 802 being defined at the disc grip 224. In one or more embodiments, when the lugs (216,217,303,303) extending from the cylindrical service jacket receiver (207) seat within the locking notches 708,709, the compression plate 802 "pinches" the frustoconical weather gasket (218) between the distal end (209) of the cylindrical service jacket receiver (207) and the compression plate 802.

In one or more embodiments, this compression force against the frustoconical weather gasket (218) reaches a maximum when the lugs (216,217,303,303) extending from the cylindrical service jacket receiver (207) are positioned between the ends of the second curvilinear section of the curvilinear receiving slots 706 and the locking notches 708,709. Thereafter, the compression force upon the frustoconical weather gasket (218) reduces slightly once the lugs (216,217,303,303) extending from the cylindrical service jacket receiver (207) seat within the locking notches 708, 709.

Thus, in one or more embodiments maximum compression of the frustoconical weather gasket (218) occurs when each lug (216,217,303,303) of the plurality of lugs (216, 217,303,303) is between the slot opening 707 and the locking notch 708. However, the compression force against the frustoconical weather gasket (218) when the lugs (216, 217,303,303) extending from the cylindrical service jacket receiver (207) seat within the locking notches 708,709 remains sufficient for there to be a waterproof seal between the service jacket (201) the distal end (209) of the cylindrical service jacket receiver (207), the compression plate 802 of the coupling nut 205 and/or the interior surfaces of the cylindrical service jacket receiver engagement ring 223.

As described above with reference to FIG. 2, in one or more embodiments the frustoconical weather gasket 218 is integrally coupled to the coupling nut 205 within the cylindrical service jacket receiver engagement ring 223. Illustrating by example, in one or more embodiments, a wide end 1501 of the frustoconical weather gasket 218 can be adhesively coupled to the compression plate 802 within the cylindrical service jacket receiver engagement ring 223. Alternatively, the frustoconical weather gasket 218 can be snap fit, press fit, or frictionally fit within the cylindrical service jacket receiver engagement ring 223 with the wide end 1501 of the frustoconical weather gasket 218 abutting the compression plate 802 of the cylindrical service jacket receiver engagement ring 223. Other techniques for fixedly attaching the frustoconical weather gasket 218 to the interior of the coupling nut 205 will be obvious to those of ordinary skill in the art having the benefit of this disclosure. In other embodiments, the frustoconical weather gasket 218 can be a separate component and can be attached to the service jacket (201) independently of the coupling nut 205, as previously described.

Turning now to FIGS. 12-13, illustrated therein is one explanatory coupling nut 1205 configured in accordance with one or more embodiments of the disclosure. FIG. 12 illustrates a front elevation view of the coupling nut 1205, while FIG. 13 illustrates a side elevation view of the coupling nut 1205. As noted above, in one or more embodiments the coupling nut 1205 is manufactured from a metal, such as brass or aluminum. However, other materials suitable for manufacturing the coupling nut 1205 will be obvious to those of ordinary skill in the art having the benefit of this disclosure.

The coupling nut 1205 of FIGS. 12-13 includes many of the same features as did the coupling nut (205) of FIGS. 6-8. For example, in one or more embodiments the coupling nut 1205 includes a cylindrical service jacket receiver engagement ring 223 extending distally from a disc grip 224. The cylindrical service jacket receiver engagement ring 223 defines one or more circumferential lug receivers 702,703, 704,805, each including a curvilinear receiving slot 706 extending from a slot opening 707 to a locking notch 708.

In the illustrative embodiment of FIGS. 12-13, the cylindrical service jacket receiver engagement ring 223 comprises a lug receiver-encircling ring 1301 as well. In one or more embodiments, the lug receiver-encircling ring 1301 is coupled to the cylindrical service jacket receiver engagement ring 223 and surrounds at least a portion of each curvilinear receiving slot 706.

In one or more embodiments, so as to avoid interference with the lugs (216,217,303,303) extending from the cylindrical service jacket receiver (207) to which the coupling nut 1205 will be attached, one or more recessed notches 1201, 1202,1203,1204 are defined along the inner surface of the lug receiver-encircling ring 1301. In this illustrative embodiment, the one or more recessed notches 1201,1202,1203, 1204 radially align with the first curvilinear section of each of the circumferential lug receivers 702,703,704,805. Accordingly, the end of each lug (216,217,303,303) extending from the cylindrical service jacket receiver (207) to which the coupling nut 1205 will be attached can pass through the recessed notches 1201,1202,1203,1204 en route to the corresponding locking notch 708.

In the illustrative embodiment of FIGS. 12-13, the lug receiver-encircling ring 1301 surrounds only a portion of each curvilinear receiving slot 706. However, in other embodiments the lug receiver-encircling ring 1301 can surround more, or less, of each curvilinear receiving slot 706 than the amount shown in FIGS. 12-13. Illustrating by example, in one or more embodiments the lug receiver-encircling ring 1301 can extend all the way from the disc grip 224 to the distal end 705 of the cylindrical service jacket receiver engagement ring 223, thereby covering all of each curvilinear receiving slot 706. Other coverage amounts by which the lug receiver-encircling ring 1301 can surround the curvilinear receiving slots 706 will be obvious to those of ordinary skill in the art having the benefit of this disclosure.

Turning now to FIGS. 14-16, illustrated therein is one explanatory frustoconical weather gasket 218 configured in accordance with one or more embodiments of the disclosure. FIG. 14 illustrates a front elevation view of the frustoconical weather gasket 218, while FIG. 15 illustrates a side elevation view of frustoconical weather gasket 218. FIG. 16 illustrates a rear elevation view of one explanatory frustoconical weather gasket 218. As noted above, the frustoconical weather gasket 218 can be made of a compressible material, such as silicone. However, other materials suitable for manufacturing the frustoconical weather gasket 218 will be obvious to those of ordinary skill in the art having the benefit of this disclosure. As also noted above, frustoconical is but one shape suitable for weather jackets configured in accordance with embodiments of the disclosure. Other cross sectional shapes will be obvious to those of ordinary skill in the art having the benefit of this disclosure.

The frustoconical weather gasket 218 has largely been described above with reference to FIG. 2. However, FIG. 15 illustrates the frustoconical shape, as the frustoconical weather gasket 218 includes a base defined by a wide end 1501, which is a wider end of the frustoconical weather gasket 218, a top 1502, which defines a narrower end of the frustoconical weather gasket 218, and one or more tapering sidewalls 1503. As shown in FIG. 15, the one or more tapering sidewalls extend inward from the wide end 1501 to the top 1502, thereby creating the shape of a frustum.

Turning now to FIGS. 17-19, illustrated therein is another explanatory toroidal weather gasket 215 configured in accordance with one or more embodiments of the disclosure. FIG. 17 illustrates a front elevation view of the toroidal weather gasket 215, while FIG. 18 illustrates a side elevation view of the toroidal weather gasket 215. FIG. 19 illustrates a rear elevation view of the toroidal weather gasket 215.

In this illustrative embodiment, the toroidal weather gasket 215 is configured as an annular ring. In this illustrative embodiment, the annular ring has a circular cross section 1801. As described above with reference to FIG. 2, in one or more embodiments the toroidal weather gasket 215 is configured to situate about the first portion (210) of a cylindrical service jacket receiver (207). In one or more embodiments, the toroidal weather gasket 215 situates between the flange (212) of the cylindrical service jacket receiver (207) and a portion of a housing (105) or electrical equipment trunk surrounding a threaded port.

While a circular cross section 1801 is one suitable configuration for the toroidal weather gasket 215, embodiments of the disclosure are not so limited. Illustrating by example, in another embodiment the toroidal weather gasket 215 can be replaced by a weather gasket having a rectangular cross section. In another embodiment, the toroidal weather gasket 215 can be replaced by a weather gasket having an ovular cross section. Other cross-sectional shapes for weather gaskets that can be substituted for the toroidal weather gasket 215 of FIGS. 17-19 will be obvious to those of ordinary skill in the art having the benefit of this disclosure.

In one or more embodiments, the toroidal weather gasket 215 can be made of a compressible material, such as silicone rubber. However, other materials suitable for manufacturing the toroidal weather gasket 215 will be obvious to those of ordinary skill in the art having the benefit of this disclosure.

Figure 21:
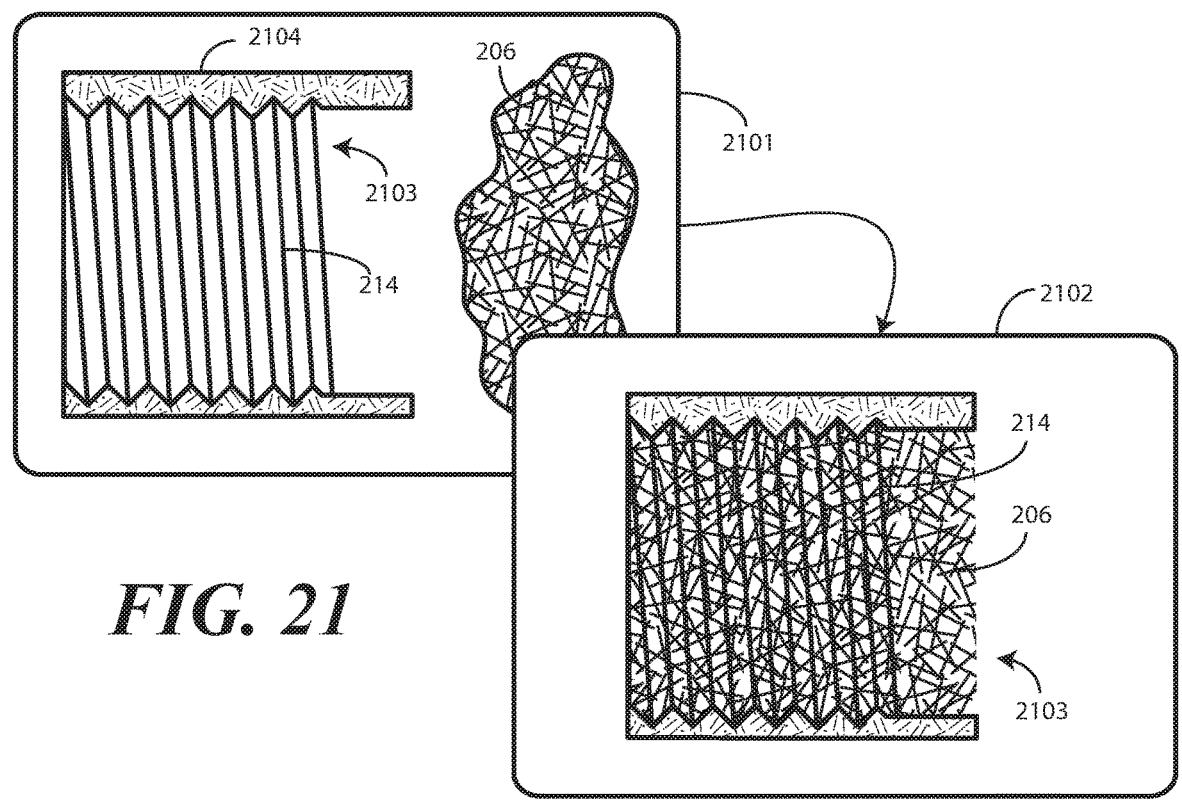
FIG. 21 illustrates one or more method steps in accordance with one or more embodiments of the disclosure.
Figure 22:
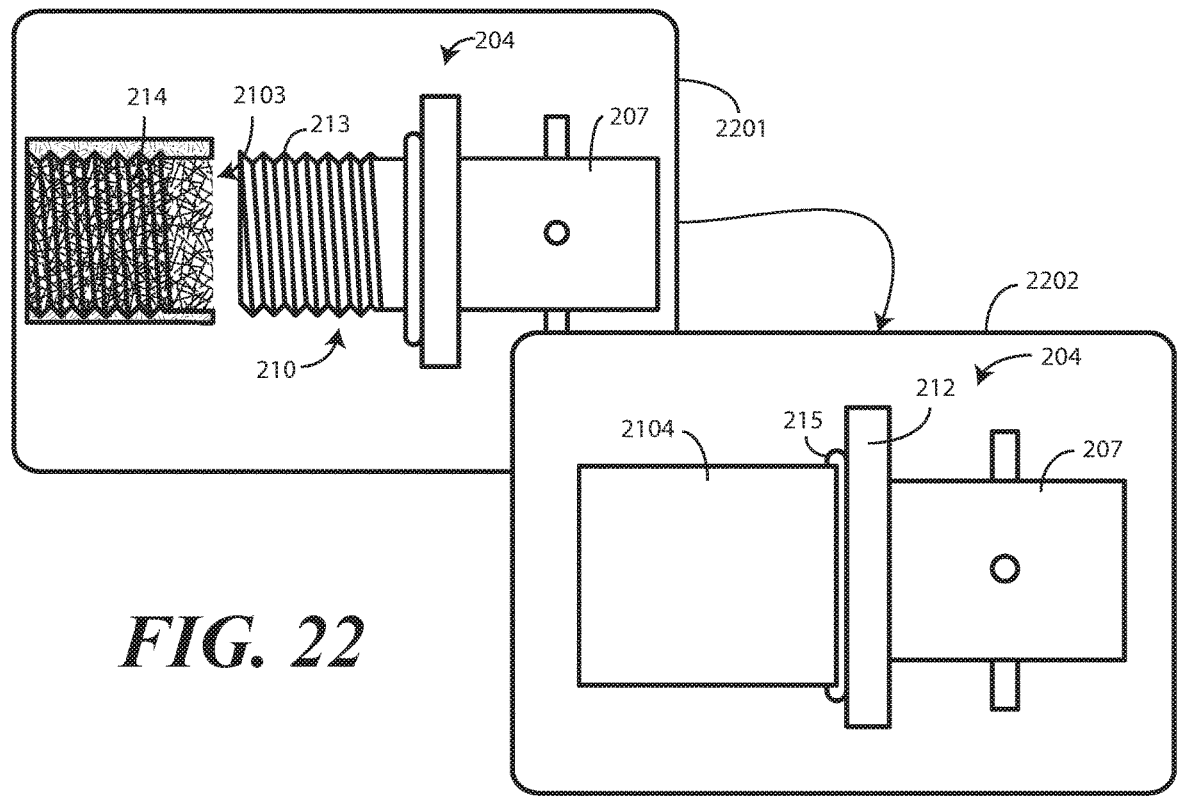
FIG. 22 illustrates one or more method steps in accordance with one or more embodiments of the disclosure.

Turning now to FIGS. 20-22, illustrated therein are one or more method steps for attaching an enclosure bushing to an electrical equipment trunk or other electrical enclosure or housing. Beginning with FIG. 20, step 2001 comprises providing an enclosure bushing 204 and a toroidal weather gasket 215. In one or more embodiments, the enclosure bushing 204 comprises a cylindrical service jacket receiver 207. In one or more embodiments, the cylindrical service jacket receiver 207 defines a lumen through which one or more optical fibers or other long, thin objects may pass.

In one or more embodiments, the cylindrical service jacket receiver 207 defines a first portion 210 and a second portion 211. In the illustrative embodiment of FIG. 2, a flange 212 separates the first portion 210 and the second portion 211.

In one or more embodiments the first portion 210 is configured to extend into, and couples to, a threaded port of an electrical equipment trunk or other electrical enclosure or housing. At step 2001, the first portion 210 includes a threaded end 213. In this illustrative embodiment, the threaded end 213 is separated from the flange 212 by a weather gasket receiver 2003.

At step 2002, the toroidal weather gasket 215 is passed over the threaded end 213 and seated on the weather gasket receiver 2003. In this illustrative embodiment, the toroidal weather gasket 215 is situated on the weather gasket receiver 2003 such that it circumscribes the weather gasket receiver 2003 and abuts the flange 212.

Turning now to FIG. 21, step 2101 comprises providing the threaded port 2103 of an electrical equipment trunk 2104. In one or more embodiments, the threaded port 2103 of the electrical equipment trunk 2104 comprises complementary threads 214 situated within the threaded port 2103. In one or more embodiments, the complementary threads 214 are complementary to the threads of the threaded end (213) of the first portion (210) of the cylindrical service jacket receiver (207) of FIG. 20.

In one or more embodiments, the enclosure bushing (204) of FIG. 20 will be perdurably coupled to the threaded port 2103. Accordingly, in one or more embodiments step 2101 comprises providing a potting adhesive 206. As shown at step 2102, in one or more embodiments the potting adhesive 206 is applied to the complementary threads 214 of the threaded port 2103.

Turning to FIG. 22, at step 2201 the threaded end 213 of the first portion 210 of the cylindrical service jacket receiver 207 of the enclosure bushing 204 is threaded into the complementary threads 214 of the threaded port 2103. In one or more embodiments, as shown at step 2202, the threaded end 213 of the first portion 210 of the cylindrical service jacket receiver 207 of the enclosure bushing 204 is threaded into the complementary threads 214 of the threaded port 2103 until the toroidal weather gasket 215 at least partially compresses between the flange 212 of the enclosure bushing 204 and a portion of the electrical equipment trunk 2104 surrounding the threaded port 2103. This ensures a watertight coupling between the enclosure bushing 204 and the electrical equipment trunk 2104 that prevents water from passing between the threaded end 213 of the first portion 210 of the cylindrical service jacket receiver 207 and the complementary threads 214 of the threaded port 2103.

In one or more embodiments, the potting adhesive (206) perdurably retains the enclosure bushing 204 in a fixed configuration within the threaded port 2103 of the electrical equipment trunk 2104 fixedly cementing the threaded end 213 to the complementary threads 214 situated within the threaded port 2103 of the electrical equipment trunk 2104. As described above, in one or more embodiments the method steps of FIGS. 20-22 are performed in the factory prior to deployment of the electrical equipment trunk 2104 in the field.

Accordingly, when a technician receives the electrical equipment trunk 2104, the electrical equipment trunk 2104 and enclosure bushing 204 define a unitary component. Where so configured, the enclosure bushing 204 is fixedly coupled to the electrical equipment trunk 2104 such that the two effectively function as a single piece, with the second portion (211) of the cylindrical service jacket receiver 207 extending distally from both the threaded port 2103 and the electrical equipment trunk 2104. In this illustrative embodiment, the cylindrical service jacket receiver 207 is fixed within the threaded port 2103 as if it was a unitary portion of the electrical equipment trunk 2104, and will not rotate within the complementary threads 214 relative to the electrical equipment trunk 2104.

Figure 23:
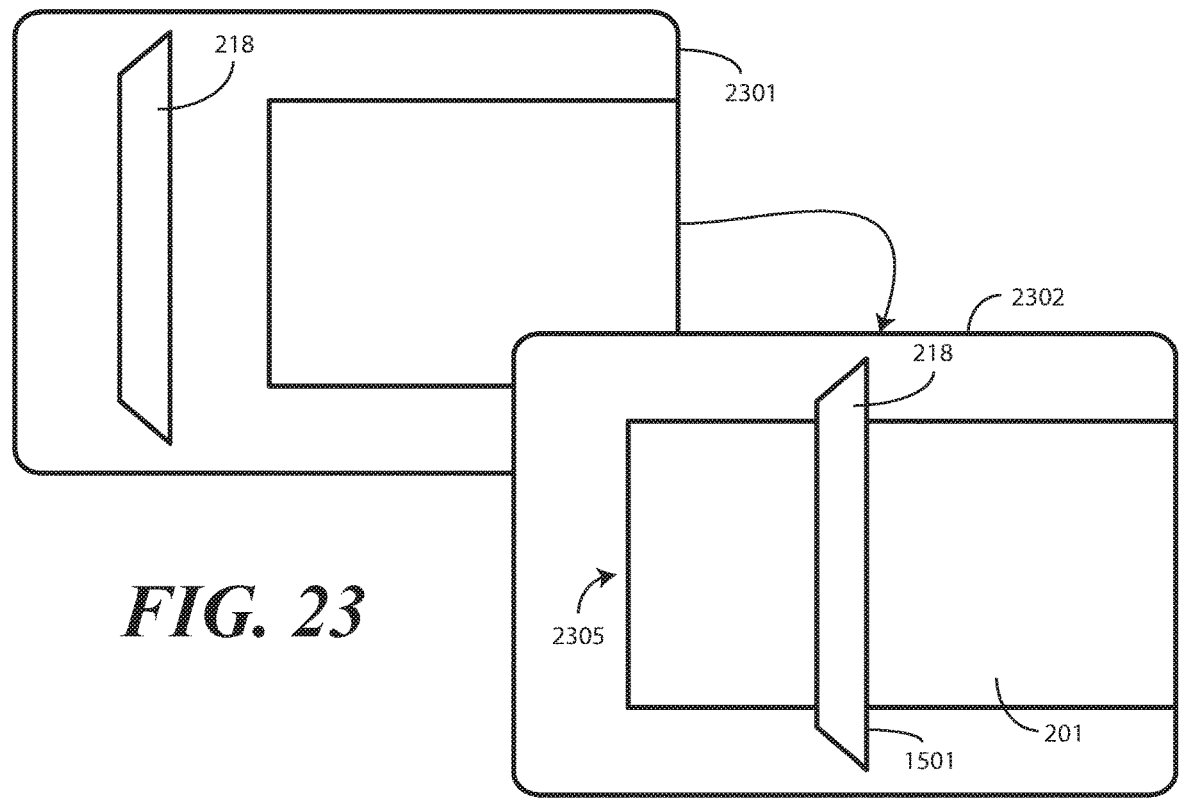
FIG. 23 illustrates one or more method steps in accordance with one or more embodiments of the disclosure.
Figure 24:
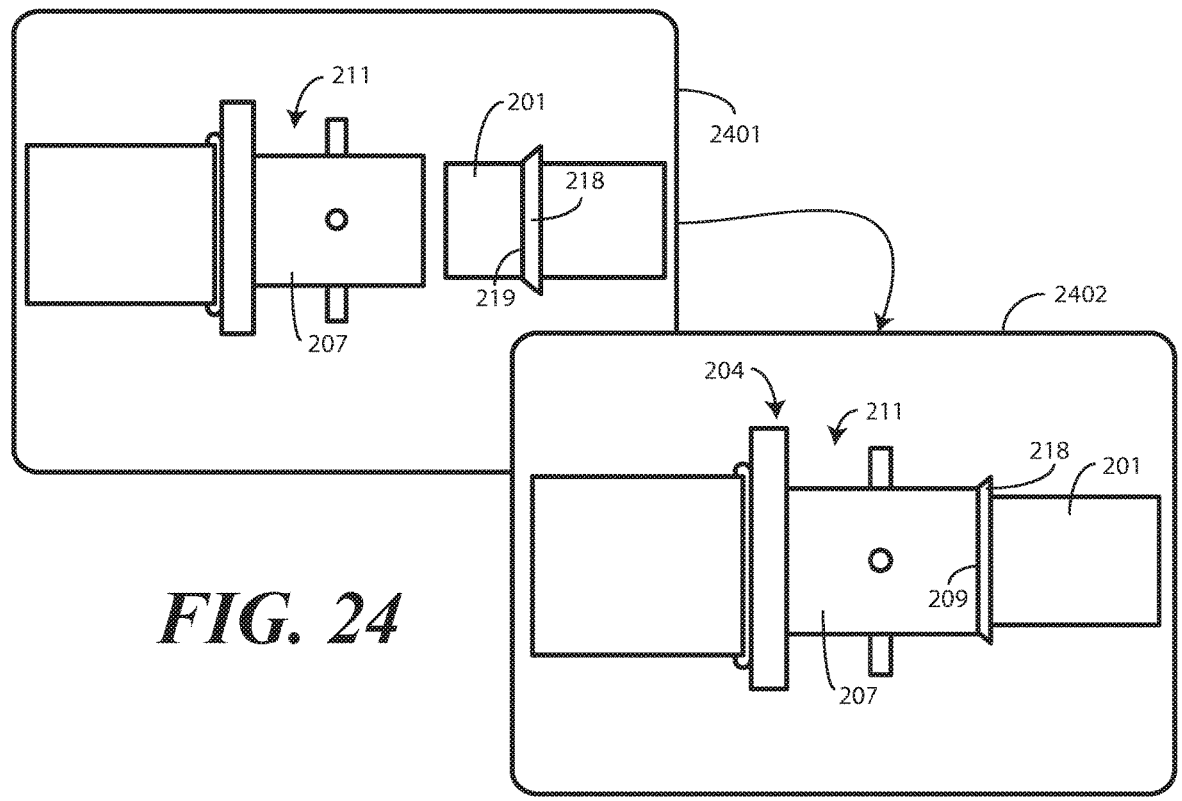
FIG. 24 illustrates one or more method steps in accordance with one or more embodiments of the disclosure.
Figure 25:
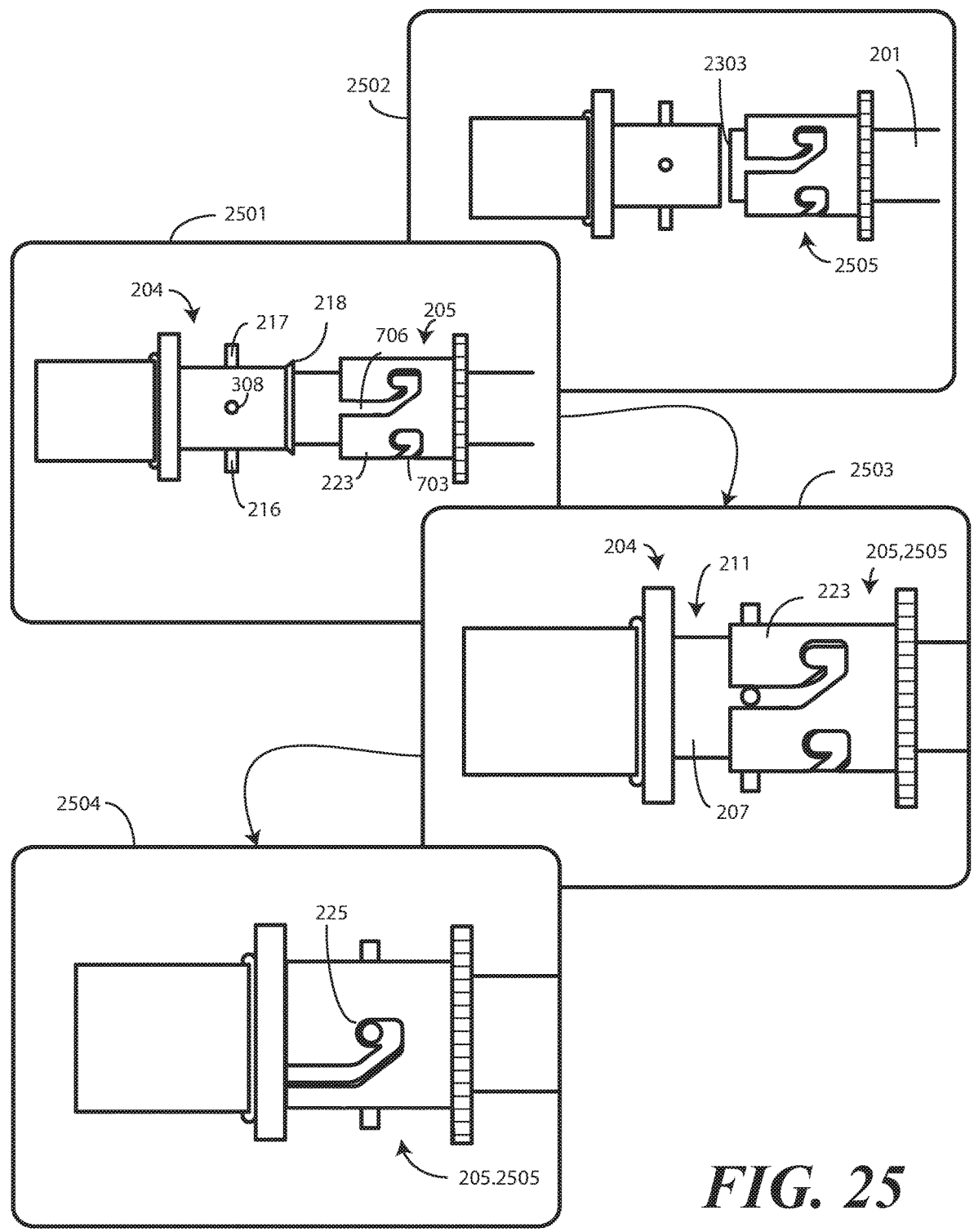
FIG. 25 illustrates one or more method steps in accordance with one or more embodiments of the disclosure.

Turning now to FIGS. 23-25, illustrated therein are one or more method steps for coupling a service jacket 201 to an enclosure bushing 204 in accordance with one or more embodiments of the disclosure. Recall from above that the frustoconical weather gasket 218 can comprise an integral component of the coupling nut 205 in some embodiments. However, in other embodiments, the frustoconical weather gasket 218 is a separate component from the coupling nut 205. FIGS. 23-24 illustrate method steps for the latter situation. Where the frustoconical weather gasket 218 is integrally coupled to the coupling nut 205, the steps of FIGS. 23-24 can be omitted.

Beginning with FIG. 23, at step 2301 the frustoconical weather gasket 218 is provided. As shown at step 2302, the frustoconical weather gasket 218 can then be coupled to a service jacket 201. In step 2302, this is accomplished by sliding the wide end 1501 of the frustoconical weather gasket 218 across the end 2303 of the service jacket 201 until a portion of the service jacket 201 passes completely through the frustoconical weather gasket 218.

The frustoconical weather gasket 218 can be coupled to the service jacket 201 in a variety of ways. Illustrating by example, in one embodiment the frustoconical weather gasket 218 can be adhesively coupled to the exterior surface of the service jacket 201. In another embodiment, the frustoconical weather gasket 218 can be thermally coupled to the exterior surface of the service jacket 201. In many embodiments, especially where the frustoconical weather gasket 218 is manufactured from a compressible material such as silicone rubber, the frustoconical weather gasket 218 will simply be placed about the service jacket 201 with friction between the frustoconical weather gasket 218 and the service jacket 201 retaining the frustoconical weather gasket 218 in place. Other techniques for coupling the frustoconical weather gasket 218 to the service jacket 201 will be obvious to those of ordinary skill in the art having the benefit of this disclosure.

Turning now to FIG. 24, at step 2401 the service jacket 201 is inserted into the second portion 211 of the cylindrical service jacket receiver 207. In this illustrative embodiment, the service jacket 201 is inserted into the lumen (208) of the second portion 211 of the cylindrical service jacket receiver 207. At step 2402, the service jacket 201 is inserted into the second portion 211 of the cylindrical service jacket receiver 207 until the frustoconical weather gasket 218 engages the cylindrical service jacket receiver 207 of the enclosure bushing 204. In one or more embodiments, the frustoconical weather gasket 218 engages the cylindrical service jacket receiver 207 of the enclosure bushing 204.

In one or more embodiments, a narrower end 219 of the frustoconical weather gasket 218 is positioned between a distal end 209 of the second portion 211 of the cylindrical service jacket receiver 207 and a wider end 220 of the frustoconical weather gasket 218 at step 2402. In one or more embodiments, a diameter (221) of an interior surface 222 of the second portion 211 of the cylindrical service jacket receiver 207 becomes wider at the distal end 209 of the second portion 211 of the cylindrical service jacket receiver 207 so as to define a frustoconical weather gasket receiver into which the frustoconical weather gasket 218 seats. This is the case in the illustrative embodiment of FIG. 24.

Turning now to FIG. 25, illustrated therein are one or more method steps illustrating coupling a service jacket 201 to an enclosure bushing 204 in accordance with one or more embodiments of the disclosure. Step 2501 depicts a continuation of FIGS. 23-25, in which case the frustoconical weather gasket 218 is a separate component from the coupling nut 205. Step 2502 depicts the first step of a method of coupling the service jacket 201 to the enclosure bushing where the frustoconical weather gasket and coupling nut are coupled together as a unitary part 2505 and after the unitary part 2505 has been placed about the service jacket 201. At step 2503, the methods effectively become the same.

Beginning at step 2501, the method includes passing the coupling nut 205 along the service jacket 201 such that the cylindrical service jacket receiver engagement ring 223 moves toward the enclosure bushing 204. As this occurs, the cylindrical service jacket receiver engagement ring 223 passes across the frustoconical weather gasket until one or more curvilinear receiving slots 706 receive one or more lugs 216,217,308 extending distally from an exterior surface of the cylindrical service jacket receiver 207, as shown at step 2503.

Turning to the situation where the frustoconical weather gasket and coupling nut are coupled together as a unitary part 2505. Beginning at step 2502, the unitary part 2505 slides over the end 2303 of the service jacket 201 with the wide end of the frustoconical weather gasket moving across the end 2303 of the service jacket 201. This sliding action continues until a portion of the service jacket 201 passes completely through the frustoconical weather gasket and out of the unitary part 2505. In this configuration, the frustoconical weather gasket frictionally couples to the service jacket 201.

At step 2504, the coupling nut 205 or unitary part 2505 passes about the cylindrical service jacket receiver 207 of the enclosure bushing 204. In one or more embodiments, the one or more lugs 216,217 extending from the outer surface of the second portion 211 of the cylindrical service jacket receiver 207 insert into the receiving slots of the cylindrical service jacket receiver engagement ring 223 of the coupling nut 205 or unitary part 2505, ultimately seating within the locking notches 225 at step 2504.

In one or more embodiments, when this occurs, the coupling nut 205 or unitary part 2505 applies a compression force (226) to the frustoconical weather gasket 218. In one or more embodiments, this compression force (226) causes the frustoconical weather gasket 218 to compress between an interior base surface of the coupling nut 205 or unitary part 2505 and the distal end (209) of the second portion 211 of the cylindrical service jacket receiver 207 of the enclosure bushing 204. This compression of the frustoconical weather gasket 218 ensures a weather tight seal between the service jacket 201 and the cylindrical service jacket receiver 207. This is due to the fact that the frustoconical weather gasket 218 becomes compressed, and thereby expands between the service jacket 201 and the cylindrical service jacket receiver 207 to fill any voids therebetween.

Advantageously, attaching the coupling nut 205 or unitary part 2505 to the enclosure bushing 204 to create this weatherproof seal between the service jacket 201 and the cylindrical service jacket receiver 207 with the frustoconical weather gasket 218 can be performed using only a single hand in one or more embodiments. Accordingly, the process does not require any special tools or torque-sensing wrenches.

Figure 26:
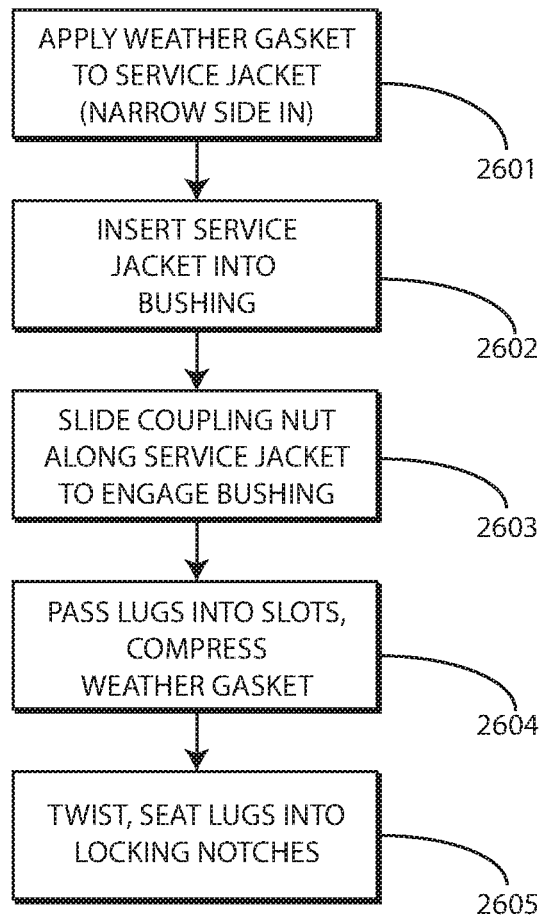
FIG. 26 illustrates one explanatory method in accordance with one or more embodiments of the disclosure.

Turning now to FIG. 26, illustrated therein is one explanatory method 2600 synthesizing the method steps described above with reference to FIGS. 23-25. Beginning at step 2601, in one or more embodiments method 2600 comprises applying a frustoconical weather gasket about an exterior of the service jacket.

In one embodiment, where the frustoconical weather gasket is a separate component from the coupling nut, step 2601 comprises placing the frustoconical weather gasket on separately from the coupling nut. Where this is the case, the placement of the coupling nut about the service jacket can preceded the placement of the frustoconical weather gasket about the service jacket, such that step 2601 comprises positioning the coupling nut about the exterior surface of the service jacket prior to applying the frustoconical weather gasket to the service jacket.

In another embodiment, where the frustoconical weather gasket and coupling nut are coupled together as a unitary part, step 2601 can comprise placing the unitary part about the service jacket such that the integrally coupled frustoconical weather gasket frictionally couples to the service jacket at the desired location. In either embodiment, where one or more optical fibers pass through the service jacket, step 2601 can comprise passing one or more optical fibers through the service jacket as well.

At step 2602, the method 2600 comprises inserting the service jacket into a lumen of a cylindrical service jacket receiver of a bushing. In one embodiment, step 2602 comprises inserting the service jacket into the lumen of a cylindrical service jacket receiver until the frustoconical weather gasket engages a distal end of the cylindrical service jacket receiver. In another embodiment, step 2602 comprises inserting the service jacket into the lumen of a cylindrical service jacket receiver until the frustoconical weather gasket engages a frustoconical weather gasket receiver located at a distal end of the cylindrical service jacket receiver.

At step 2603, the method comprises passing a coupling nut across an exterior surface of the cylindrical service jacket receiver. In one or more embodiments, step 2603 comprises passing the coupling nut across the exterior surface of the cylindrical service jacket receiver until, at step 2604, one or more circumferential lug receivers receive one or more lugs extending distally from the exterior surface of the cylindrical service jacket receiver.

At step 2605, the method 2600 comprises twisting the coupling nut. In one or more embodiments, step 2605 thereby causes each lug of the one or more lugs to engage a locking notch terminating each circumferential lug receiver of the one or more circumferential lug receivers. In one or more embodiments, step 2605 results in the coupling nut applying a compression force to the frustoconical weather gasket while the coupling nut is twisting.

Embodiments of the disclosure, as illustrated and described above, provide several features and benefits. Among these are the use of a frustoconical weather gasket to create weatherproof seal in a connector that can be connected with a single hand and without the need for any tools. Moreover, in one or more embodiments the coupling nut can be easily coupled to the enclosure bushing with a quarter turn, quick connect quick disconnect twist-lock mechanism.

In one or more embodiments, a single frustoconical weather gasket is used. There is no need for multiple sections, multiple O-rings, and multiple threaded connections. As noted numerous times above, embodiments of the disclosure require neither specialized tools nor torque-measuring wrenches. In one or more embodiments, the coupling nut includes a disc (or other shaped grip) that includes large ergonomic features for human grasp and twist. Finally, with embodiments of the disclosure, appropriate sealing pressure is guaranteed by design and is achievable without wrenches.

Figure 27:
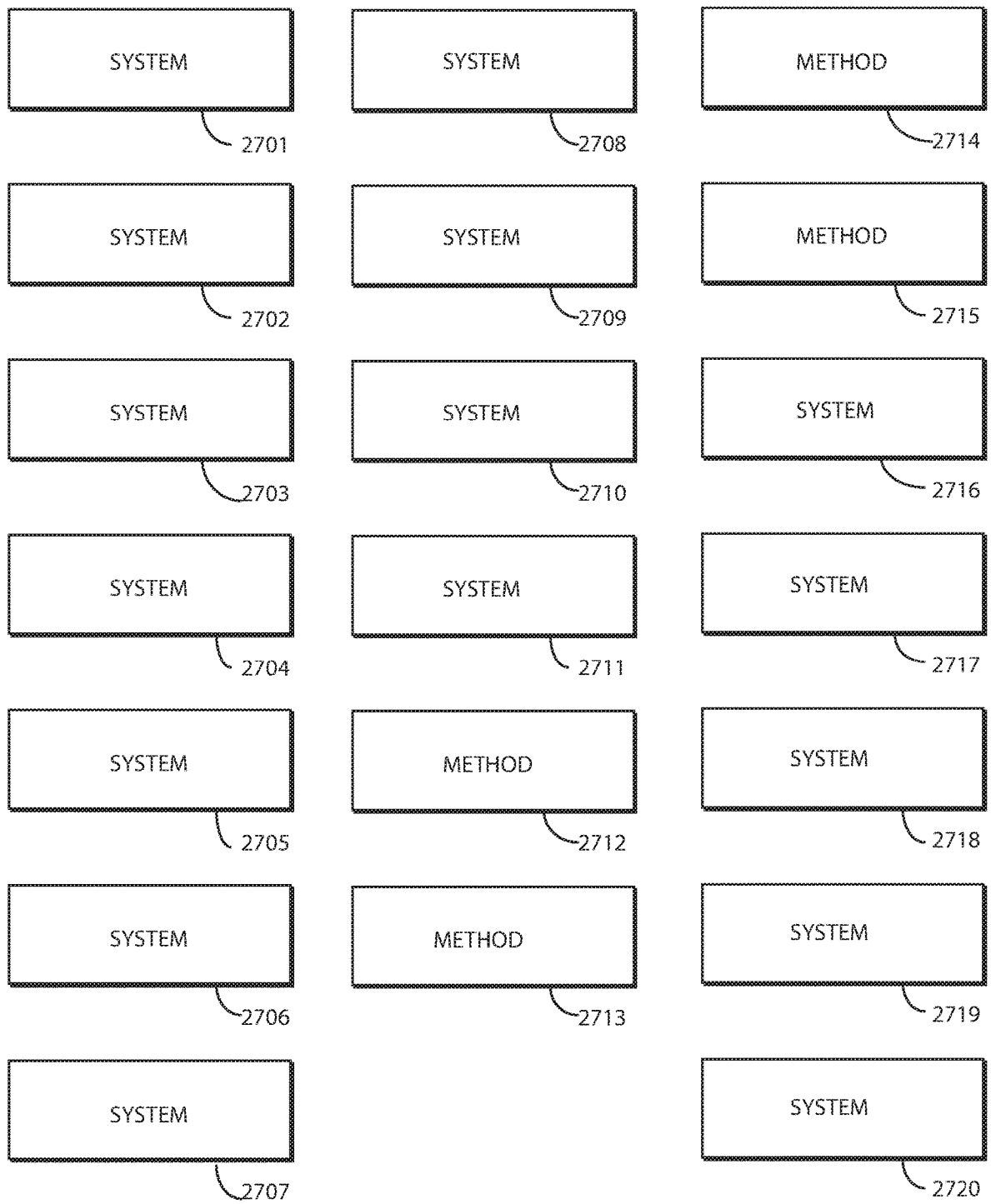
FIG. 27 illustrates one or more embodiments of the disclosure.

Turning now to FIG. 27, illustrated therein are various embodiments of the disclosure. At 2701, a system comprises a housing. At 2701, the housing comprises a base. At 2701, the housing comprises a lid pivotably coupled to the base by one or more hinges. At 2701, the housing comprises one or more electronic components situated within the housing.

At 2701, one or more of the base or the lid comprise one or more ports through which electrical connections to the one or more electronic components can be made from exterior of the housing. At 2701, at least one bushing is coupled to at least one port.

At 2701, the at least one bushing comprises a cylindrical service jacket receiver defining a lumen through which the electrical connections to the one or more electronic components can be made from the exterior of the housing. At 2701, the at least one bushing comprises a flange abutting a portion of the housing, with a portion of the cylindrical service jacket receiver extending distally from the flange and the housing. At 2701, the at least one bushing comprises one or more lugs extending from the portion of the cylindrical service jacket receiver.

At 2702, the system of 2701 further comprises a weather gasket situated between the flange and the portion of the housing abutting the flange. At 2703, the at least one bushing of 2702 comprises another portion of the cylindrical service jacket receiver extending into the at least one port. At 2703, the weather gasket of 2702 is coupled to an outer surface of the another portion of the cylindrical service jacket receiver. At 2704, the another portion of the cylindrical service jacket receiver of 2703 comprises a plurality of threads engaging a plurality of complementary threads of the at least one port.

At 2705, the system of 2701 further comprises a service jacket inserted into the portion of the cylindrical service jacket receiver. At 2705, the system comprises a frustoconical weather gasket coupled to and circumscribing the service jacket. At 2706, a narrower end of the frustoconical weather gasket is positioned between the portion of the cylindrical service jacket receiver and a wider end of the frustoconical weather gasket.

At 2707, a diameter of an interior surface of the portion of the cylindrical service jacket receiver of 2706 becomes wider at a distal end of the portion of the cylindrical service jacket receiver, thereby defining a frustoconical weather gasket receiver. At 2708, the system of 2707 further comprises a coupling nut encircling the service jacket. At 2708, the coupling nut has a cylindrical service jacket receiver engagement ring defining one or more circumferential lug receivers.

At 2709, the one or more circumferential lug receivers of 2708 each comprise a receiving slot and a locking notch situated at a terminal end of the receiving slot. At 2710, the coupling nut of 2709 applies a compression force to the frustoconical weather gasket when the one or more lugs engaging the locking notch of the one or more circumferential lug receivers. At 2711, the system of 2710 further comprises one or more optical fibers situated within the service jacket and passing from the exterior of the housing, through the lumen, and into the housing.

At 2712, a method of coupling a service jacket to a port of a housing comprises applying a frustoconical weather gasket about an exterior of the service jacket. At 2712, the method comprises inserting the service jacket into a lumen of a cylindrical service jacket receiver of a bushing until the frustoconical weather gasket engages a frustoconical weather gasket receiver.

At 2712, the method comprises passing a coupling nut across an exterior surface of the cylindrical service jacket receiver until one or more circumferential lug receivers receive one or more lugs extending distally from the exterior surface of the cylindrical service jacket receiver. At 2712, the method comprises twisting the coupling nut, thereby causing each lug of the one or more lugs to engage a locking notch terminating each circumferential lug receiver of the one or more circumferential lug receivers.

At 2713, the method of 2712 further comprises applying, with the coupling nut, a compression force to the frustoconical weather gasket while twisting the coupling nut. At 2714, the method of 2713 further comprises positioning the coupling nut about the exterior surface of the service jacket prior to applying the frustoconical weather gasket. At 2715, the method of 2714 further comprises passing one or more optical fibers through the service jacket.

At 2716, a system comprises an electrical equipment trunk defining at least one threaded port, through which exterior equipment can be coupled to electrical equipment situated within the electrical equipment trunk. At 2716, the system comprises at least one threaded bushing, perdurably coupled to the at least one threaded port. At 2716, the at least one threaded bushing comprises a flange, a cylindrical service jacket receiver extending distally away from the flange, and a plurality of lugs extending from an exterior surface of the cylindrical service jacket receiver.

At 2716, the system comprises a service jacket inserted into the cylindrical service jacket receiver with a weather gasket circumscribing the service jacket and abutting the cylindrical service jacket receiver. At 2716, the system comprises a coupling nut defining a plurality of lug receivers engaging the plurality of lugs on a one-to-one basis. At 2716, the coupling nut compresses the weather gasket against the cylindrical service jacket receiver.

At 2717, the system of 2716 comprises another weather gasket situated between the flange and a portion of the electrical equipment trunk surrounding the at least one threaded port. At 2718, the weather gasket of 2716 further comprises a frustoconical weather jacket. At 2718, the cylindrical service jacket receiver of 2716 defines a complementary frustoconical weather jacket receiver. At 2718, the coupling nut of 2716 compresses the frustoconical weather jacket against the complementary frustoconical weather jacket receiver.

At 2719, each lug of the plurality of lugs of 2716 has a cylindrical cross section across a minor axis. At 2720, each lug receiver of the plurality of lug receivers of 2716 comprises a curvilinear receiving slot extending between a slot opening and a locking notch, wherein maximum compression of the weather gasket occurs when each lug of the plurality of lugs is between the slot opening and the locking notch.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A system, comprising:
   a housing, comprising:
   a base;
   a lid pivotably coupled to the base by one or more hinges; and
   one or more electronic components situated within the housing;
   one or more of the base or the lid comprising one or more ports through which electrical connections to the one or more electronic components can be made from exterior of the housing;
   at least one bushing coupled to at least one port, the at least one bushing comprising:
   a cylindrical service jacket receiver defining a lumen through which the electrical connections to the one or more electronic components can be made from an exterior of the housing;
   a flange abutting a portion of the housing, with a portion of the cylindrical service jacket receiver extending distally from the flange and the housing;
   one or more lugs extending from the portion of the cylindrical service jacket receiver and
   a service jacket inserted into the portion of the cylindrical service jacket receiver; and
   a frustoconical weather gasket coupled to and circumscribing the service jacket.

2. The system of claim 1, further comprising a weather gasket situated between the flange and the portion of the housing abutting the flange.

3. The system of claim 2, the at least one bushing comprising another portion of the cylindrical service jacket receiver extending into the at least one port, the weather gasket coupled to an outer surface of the another portion of the cylindrical service jacket receiver.

4. The system of claim 3, the another portion of the cylindrical service jacket receiver comprising a plurality of threads engaging a plurality of complementary threads of the at least one port.

5. The system of claim 1, wherein a narrower end of the frustoconical weather gasket is positioned between the portion of the cylindrical service jacket receiver and a wider end of the frustoconical weather gasket.

6. The system of claim 5, wherein a diameter of an interior surface of the portion of the cylindrical service jacket receiver becomes wider at a distal end of the portion of the cylindrical service jacket receiver, thereby defining a frustoconical weather gasket receiver.

7. The system of claim 6, further comprising a coupling nut encircling the service jacket, the coupling nut having a cylindrical service jacket receiver engagement ring defining one or more circumferential lug receivers.

8. The system of claim 7, the one or more circumferential lug receivers each comprising a receiving slot and a locking notch situated at a terminal end of the receiving slot.

9. The system of claim 8, wherein the coupling nut applies a compression force to the frustoconical weather gasket when the one or more lugs engaging the locking notch of the one or more circumferential lug receivers.

10. The system of claim 9, further comprising one or more optical fibers situated within the service jacket and passing from the exterior of the housing, through the lumen, and into the housing.

11. A method of coupling a service jacket to a port of a housing, the method comprising:
   applying a frustoconical weather gasket about an exterior of the service jacket;
   inserting the service jacket into a lumen of a cylindrical service jacket receiver of a bushing until the frustoconical weather gasket engages a frustoconical weather gasket receiver;
   passing a coupling nut across an exterior surface of the cylindrical service jacket receiver until one or more circumferential lug receivers receive one or more lugs extending distally from the exterior surface of the cylindrical service jacket receiver; and
   twisting the coupling nut, thereby causing each lug of the one or more lugs to engage a locking notch terminating each circumferential lug receiver of the one or more circumferential lug receivers.

12. The method of claim 11, further comprising applying, with the coupling nut, a compression force to the frustoconical weather gasket while twisting the coupling nut.

13. The method of claim 12, further comprising positioning the coupling nut about the exterior surface of the service jacket prior to applying the frustoconical weather gasket.

14. The method of claim 13, further comprising passing one or more optical fibers through the service jacket.

15. A system comprising:
   an electrical equipment trunk defining at least one threaded port, through which exterior equipment can be coupled to electrical equipment situated within the electrical equipment trunk;
   at least one threaded bushing, perdurably coupled to the at least one threaded port, and comprising a flange, a cylindrical service jacket receiver extending distally away from the flange, and a plurality of lugs extending from an exterior surface of the cylindrical service jacket receiver;
   a service jacket inserted into the cylindrical service jacket receiver with a weather gasket circumscribing the service jacket and abutting the cylindrical service jacket receiver; and
   a coupling nut defining a plurality of lug receivers engaging the plurality of lugs on a one-to-one basis, the coupling nut compressing the weather gasket against the cylindrical service jacket receiver.

16. The system of claim 15, further comprising another weather gasket situated between the flange and a portion of the electrical equipment trunk surrounding the at least one threaded port.

17. The system of claim 15, the weather gasket comprising a frustoconical weather jacket, the cylindrical service jacket receiver defining a complementary frustoconical weather jacket receiver, the coupling nut compressing the frustoconical weather jacket against the complementary frustoconical weather jacket receiver.

18. The system of claim 15, each lug of the plurality of lugs having a cylindrical cross section across a minor axis.

19. The system of claim 15, each lug receiver of the plurality of lug receivers comprising a curvilinear receiving slot extending between a slot opening and a locking notch, wherein maximum compression of the weather gasket occurs when each lug of the plurality of lugs is between the slot opening and the locking notch.

\* \* \* \* \*